(12) United States Patent
Parise

(10) Patent No.: US 7,068,991 B2
(45) Date of Patent: *Jun. 27, 2006

(54) REMOTE POWER RECHARGE FOR ELECTRONIC EQUIPMENT

(76) Inventor: Ronald J. Parise, 101 Wendover Rd., Suffield, CT (US) 06078

( * ) Notice: Subject to any disclaimer, the term of this patent is extended or adjusted under 35 U.S.C. 154(b) by 68 days.

This patent is subject to a terminal disclaimer.

(21) Appl. No.: 10/747,826

(22) Filed: Dec. 29, 2003

(65) Prior Publication Data
US 2004/0142733 A1    Jul. 22, 2004

Related U.S. Application Data

(63) Continuation-in-part of application No. 09/648,951, filed on Aug. 25, 2000, now Pat. No. 6,792,259, which is a continuation of application No. 09/436,291, filed on Nov. 8, 1999, now Pat. No. 6,114,834, which is a continuation of application No. 08/934,270, filed on Sep. 19, 1997, now Pat. No. 5,982,139.

(60) Provisional application No. 60/046,027, filed on May 9, 1997.

(51) Int. Cl.
*H04Q 7/20* (2006.01)
(52) U.S. Cl. .............................. 455/343.1; 455/127.1; 320/109
(58) Field of Classification Search ........ 455/571–574, 455/343.1, 343.2, 127; 320/101–109; 340/333, 340/10.34, 905, 908, 870.31, 870.16, 568.1; 375/258; 361/235; 701/22; 322/2 R; 482/94, 482/8
See application file for complete search history.

(56) References Cited

U.S. PATENT DOCUMENTS

| 5,515,399 | A | * | 5/1996 | Swart | 375/258 |
| 5,982,139 | A | * | 11/1999 | Parise | 320/109 |
| 6,114,834 | A | * | 9/2000 | Parise | 320/109 |
| 6,792,259 | B1 | * | 9/2004 | Parise | 455/343.1 |

* cited by examiner

Primary Examiner—Jean Gelin
(74) Attorney, Agent, or Firm—Alix, Yale & Ristas, LLP

(57) ABSTRACT

A conductorless charging and power system for electronic appliances and method for communicating power to a power receiver employing wireless energy transmission are disclosed. The remote charging system includes a power transmission unit, which transmits energy as a directional power beam, and a power receiver system that receives the transmitted energy. The power receiver system is preferably incorporated in an appliance and includes an energy receptor capable of receiving the wireless power beam and transferring the energy from the beam to an energy storage device included in the appliance. The power transmission unit receives and tracks a power request signal from the power receiver system to track the power receiver system location during energy transmission. Data streams may be incorporated into the wireless signals of the remote charging system, allowing the remote charging system to function as a communications pathway as well as a power delivery system.

51 Claims, 30 Drawing Sheets

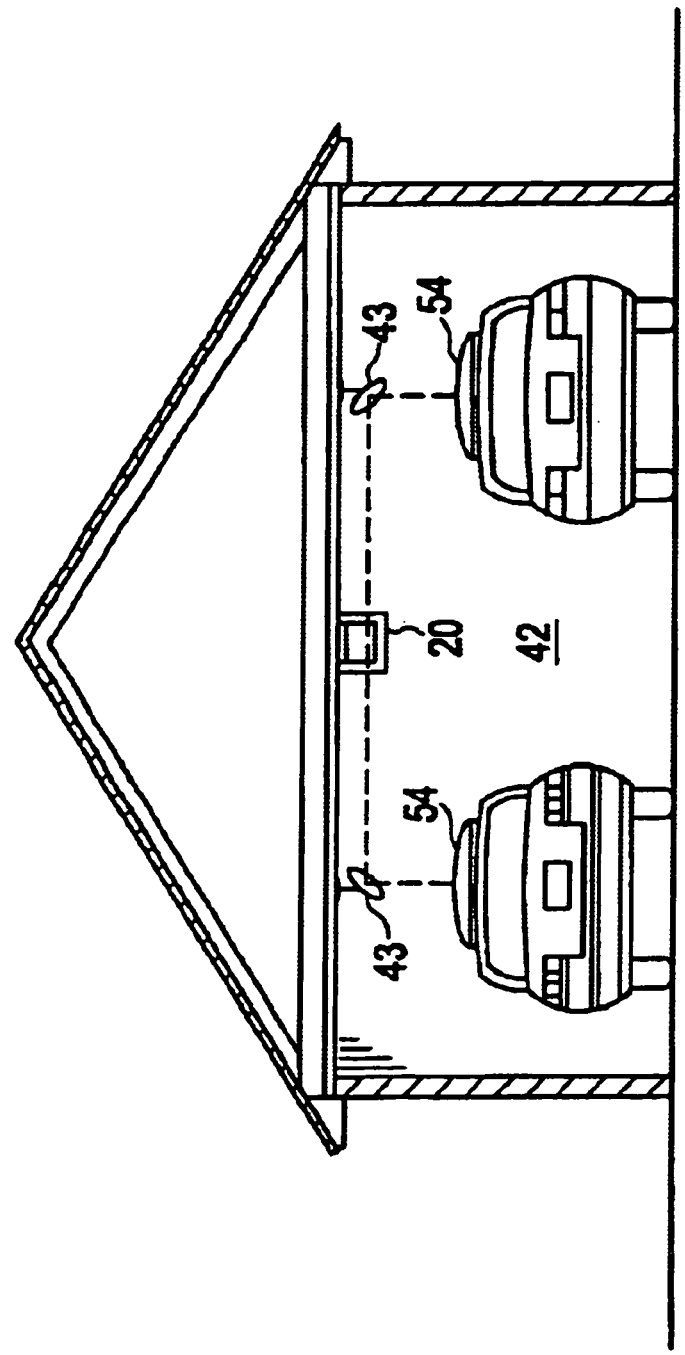

REMOTE POWER RECHARGE FOR ELECTRONIC EQUIPMENT

CROSS-REFERENCE TO RELATED APPLICATION

This is a continuation-in-part application of U.S. patent application Ser. No. 09/648,951, filed Aug. 25, 2000 now U.S. Pat. No. 6,792,259, which is a continuation of U.S. patent application Ser. No. 09/436,291, filed Nov. 8, 1999, now U.S. Pat. No. 6,114,834, which is a continuation of U.S. patent application Ser. No. 08/934,270, filed Sep. 19, 1997, now U.S. Pat. No. 5,982,139, which claims the benefit of U.S. Provisional Application No. 60/046,027, filed May 9, 1997.

BACKGROUND OF THE INVENTION

The present invention relates in general to a wireless power transmission system. One particular aspect of the present invention relates to a remote power transmission system for recharging electronic equipment.

Millions of portable electronic devices are in use today. Each of these devices typically employs a rechargeable battery pack that requires periodic connection to a charger. Many simply forget to connect the equipment to the charger and are left without sufficient power to use their portable electronics. Frequently, the portable electronic equipment is being used in locations where an outlet for the charger is simply not available. The present invention relates to a system for wirelessly delivering electrical power to portable electronic devices.

Wireless power transmission is defined as a point-to-point energy or power transmission through free space (a vacuum), the atmosphere, or other media without the use of conductors. Attenuation of the energy from the transmitter to the receiver is not a function of the distance that separates them unless the medium through which the energy travels affects the energy. For example, in a perfect vacuum, the power beam would travel indefinitely, no matter the distance. This can also be referred to as a conductorless power transmission. This is contrary to an induction system, for example, which must have a minimum to zero distance between the induction coils in order to function.

Originally, a conductorless power transmission system was proposed to augment the existing system of electrical conductors that are used to move large quantities of electrical power over long distances. Later, systems were proposed to convert large quantities of solar energy into an energy beam that could be transmitted from outer space to the surface of the earth through satellite transmissions. Once on earth the energy beam would be converted back to a usable energy form that would be pumped into the existing electrical energy distribution grid. See for instance U.S. Pat. Nos. 3,114,517; 3,781,647; and 3,174,705. Several transmission frequencies of the energy spectrum have been considered to minimize the energy loss from the beam as it travels through the atmosphere, including radio frequency (RF), laser, and optical frequency (OF). For the RF energy beam, atmospheric attenuation is a minimum up to 4 GHz even during a heavy rainstorm. Other windows of transmission exist at 35 GHz and 94 GHz. Systems designed to operate at these relatively high frequencies have the added advantage of operating at smaller apertures wherein the transmitting antenna and the receiving antenna can be smaller. Such systems have been considered for transmission of energy from satellites in a low earth orbit or geosynchronous orbit to the surface of the earth, a distance of many kilometers. Transmitting from space to the surface of the earth greatly diminishes laser based energy beam capabilities due to the long distances the laser beam must travel in the earth's atmosphere.

A wireless remote system capable of transmitting energy distances of 100 to 500 meters typically is all that is needed. At these relatively short distances, even taking into account additional power requirements for attenuation in the earth's atmosphere, many more RF bands become available. Energy transmission via a laser beam also becomes viable. Laser energy beam transmission has the additional advantage of requiring relatively small transmitting and receiving antennae.

SUMMARY OF THE INVENTION

Briefly stated, the invention in simplified form comprises a power transmission unit and a power receiver system. In some embodiments there are a plurality of power transmission units, each interconnected to a power source such as, for instance, the existing electrical power transmission grid. Each power transmission unit (PTU) includes a power transmitter selectively activatable between the on and off condition. In the on condition, the power transmitter transforms energy from the power source into a directionally transmitted conductorless power beam. The power transmission unit also preferably comprises communication components for sending and/or receiving a communication signal and a power unit controller operably connected to both the communication device and power transmitter. The power unit controller device is preferably a logic type device incorporating microprocessors and functions to control the overall operation of the power transmission unit. In other embodiments the power transmission unit includes safety devices, signal locating and tracking capabilities as well as a device or devices to change the focus and/or orientation of the directional power beam transmitted by the power transmitter.

The power receiving system (PRS) is preferably comprised of a number of operably interconnected components. The PRS will include an energy receptor, such as an antenna, receptor/converter or combination receiver/antenna (rectenna). The energy receptor receives the power beam transmitted from the power transmitter. The PRS will also comprise an energy converter, which converts the energy received by the receptor to a form capable of storage in an energy storage device. A power usage monitor monitors the energy level in the energy storage device and preferably the energy being expended and energy being received by the energy receiving means. A transmitter/locator or "translocator" is operably connected to the power usage monitor. The translocator functions to transmit a translocator signal from a translocator antenna.

In some embodiments the PRS is incorporated into an appliance such as a cell phone or a vehicle. It should be understood that the terms "appliance" and "vehicle" are meant to encompass any and all electronic devices and vehicle types, respectively unless specifically limited. A surface vehicle may similarly be of any type for use on or near any surface such as, for example, boats, cars, trucks, golf carts, hovercraft or amusement park rides. Each vehicle would have many of the attributes of presently existing vehicles. Passenger cars for instance would typically include well known provisions for steering, speed control, suspension, braking, heating, ventilation and air-conditioning, etc.

The motor for the vehicle could be any type that is able to utilize the energy received and/or stored by the vehicle, as later described.

In use of a preferred form of the invention, the vehicle or appliance would be employed in conventional settings, e.g., inside buildings, in urban settings and in rural areas. For example, a vehicle would travel along existing roads. Each appliance is independent, relying on its own PRS supplied with energy received from PTUs incorporated into the use environment. The power usage monitor constantly checks the amount of energy contained within the energy storage device as well as the amount and rate at which energy is being withdrawn from the energy storage device. When the level of energy in the energy storage device falls below a predetermined level, the power usage monitor activates the translocator to start transmission of a PRS communication signal requesting energy from a PTU.

The PRS communication signal is received by a PTU via the power unit communication device. A power unit controller "interprets" the PRS communication signal as a request for conductorless power transmission and locates the source of the PRS communication signal, which is, of course, the location of the appliance requesting power, or more preferably, the location of the energy receptor of the appliance. Once the appliance energy receptor is located, the power unit controller employs a communication signal tracking module and transmitter aiming control to orient the power transmitter and initiates broadcast of the directional power beam to the energy receptor. Naturally, if the appliance is moving as is likely the case for a cell phone or vehicle, the PTU continues to track the appliance location via the PRS communication signal and adjust the power transmitter so that the directional power beam remains aligned with the appropriate energy receptor. When the appliance has received sufficient energy, the translocator terminates the PRS communication signal, causing the power unit controller to cease power beam transmission.

In some embodiments the power usage monitor tracks the energy received by the energy receptor. Energy reception data may be part of the PRS communication signal transmitted to the PTU. The remote power system may be configured to terminate power beam transmission if the PRS fails to acknowledge the receipt of power from the PTU. This acts as a fail-safe should the power beam be interrupted or should the power beam and energy receptor become misaligned. Given the relatively short distance between the PTU and energy receptor and the fact that the power beam and communication signal travel at the speed of light, communication between the PRS and PTU is almost instantaneous and takes place before the energy receptor has moved any significant distance.

In another aspect of the invention the power beam comprises a series of pulses or energy packets, receipt of each or some number of which must be acknowledged by the PRS in a PRS communication signal before the next pulse or pulses are transmitted by the power transmitter to the energy receptor.

In a further aspect of the invention the PRS communication signal comprises a data stream transferring information to the power unit controller. In this way, each PRS may be uniquely identified so that a PTU receiving multiple communication signals can locate and track an individual energy receptor.

In another embodiment the appliance also includes a translocator energy unit operably connected to the PRS. The translocator energy unit is a logic device having a user determinable number of energy credits. The PRS communication signal, as part of the data stream, may include the number of energy credits contained on the translocator energy unit. As a PTU transmits the power beam to an appliance, the energy credits are electronically exchanged for quantities of power transmitted. When the energy credits in the translocator energy unit are depleted the translocator signal is terminated and the power unit controller stops transmission of the power beam. No further power transmission will be received by that appliance until the energy credits contained in the translocator energy unit are replenished.

In a further embodiment the PTU communication device may also comprise a transmitter and the translocator may comprise a receiver. In this manner, when the communication signal is received by the PTU, a PTU communication signal can be returned to the PRS, establishing two-way communication between the PTU and the PRS. In this embodiment, transmission of the power beam may be predicated on establishment of two-way communication between the PTU and PRS.

An object of the invention is to provide a new and improved wireless power transmission system and method.

Another object of the invention is to provide a new and improved wireless (conductorless) power transmission system and method, which is especially suited for use in short range, urban environments.

A further object of the invention is to provide a system and method for receiving wireless energy and converting the received energy to a different form.

Still another object of the invention is to provide an energy safety system and method.

A still further object of the invention is to provide a hybrid energy storage device.

A yet further object of the invention is to provide a new and improved wireless power recharge system for electronic equipment.

BRIEF DESCRIPTION OF THE DRAWINGS

Other objects and advantages of the invention will become apparent from the detailed description and the drawings, in which:

FIG. 10 is a side view of an embodiment of a power transmission unit installed in a garage;

DETAILED DESCRIPTION OF THE PREFERRED EMBODIMENTS

Figure 1:
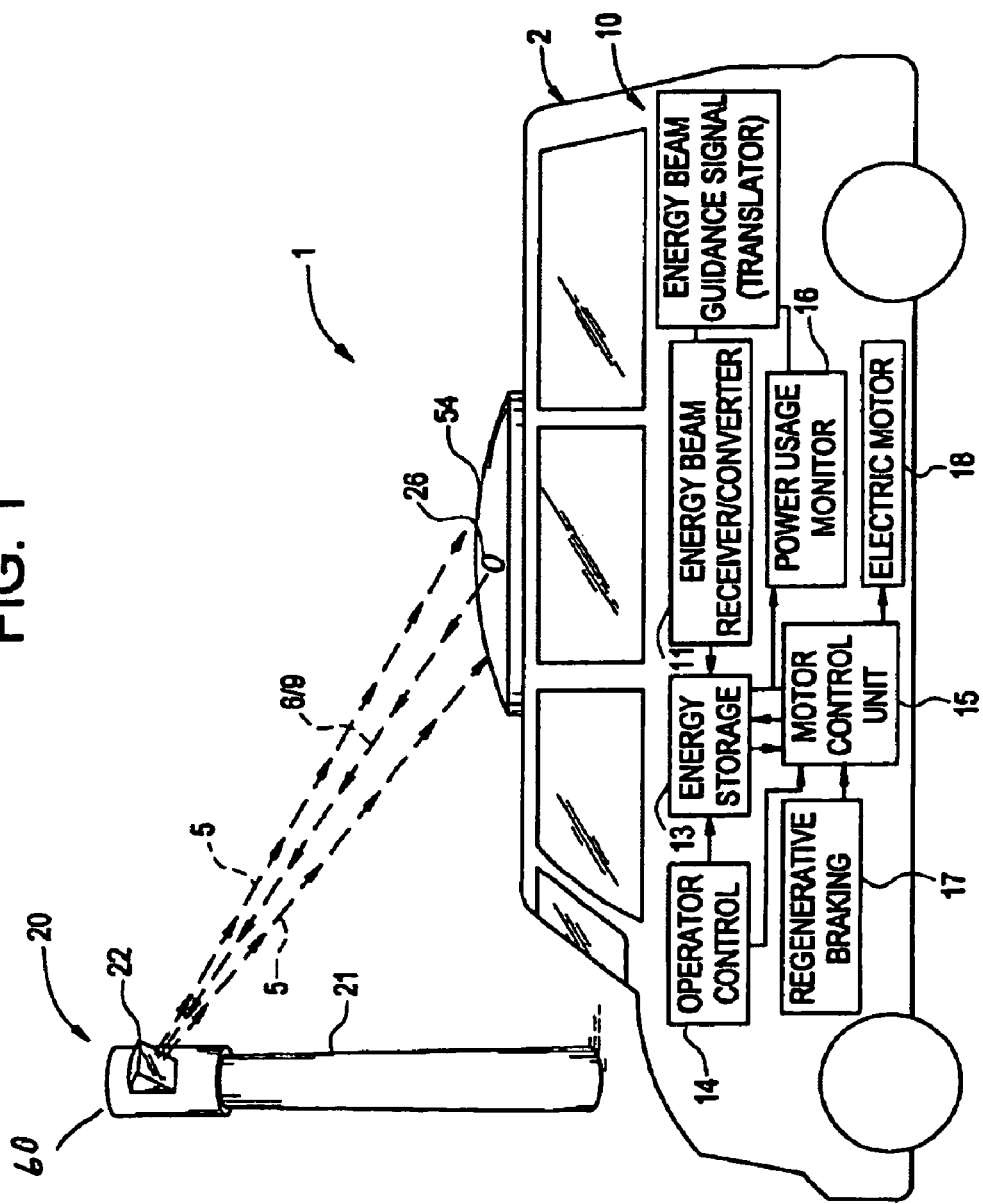
FIG. 1 is a schematic illustration of an electric vehicle incorporating an embodiment of the remote power system of the present invention.

The disclosures of U.S. patent application Ser. No. 09/648,951, filed Aug. 25, 2000, U.S. patent application Ser. No. 09/436,921 filed Nov. 8, 1999, and U.S. patent application Ser. No. 08/934,270 filed Sep. 16, 1997, now U.S. Pat. No. 5,982,139, are incorporated by reference herein.

With reference to the drawings wherein like numerals represent like components or structures throughout the figures, a remote power system according to aspects of the present invention is generally represented by the numeral 1. As shown in functional block diagrams FIGS. 11A–11C, the remote power system comprises a power transmission unit (PTU) 20 and a power receiving system (PRS) 44. A remote power system according to aspects of the present invention is a flexible multi-use system whose basic components and functions may be supplemented with additional features appropriate for a particular intended use. The remote power system will be broadly described in the context of power delivery to an "appliance". The term "appliance" should be broadly interpreted to encompass any device that runs on electricity or requires electric power, from an electric vehicle to a cell phone. As will be described in greater detail below, various embodiments of the remote power system are adapted to complement the appliance being powered.

The function and cooperation among the basic components of a remote power system 1 will now be described with reference to FIGS. 11A–11C. The PTU 20 comprises a power transmitter 22, a power unit controller 48 and a power unit communication receiver 46. In some embodiments the PTU 20 is a stationary, ground-based unit electrically connected to a power source. The PTU 20 may be connected to the existing electrical power transmission grid (not shown) and mounted on utility poles 21 or other existing ground structure such as buildings, signs, etc. Alternatively, the PTU 20 may incorporate a PRS and be supplied with energy remotely from another PTU. This arrangement may be employed in rural environments where power grid connections do not exist.

A major function of the PTU 20 is to transmit a wireless or conductorless energy beam to an appliance when called upon to do so. The power transmitter 22 converts energy from the connected power source (electricity in the case of an existing power grid) to a directional wireless power beam 5. The conversion of energy to a directional power beam 5 is well known. For instance, power beams in microwave energy form may be created using a magnetron, a klystron or a traveling-wave tube. Power beams in laser energy form may be created by one of many known solid, liquid or gas laser systems. In some embodiments the PTU 20 includes a communication signal tracking module 50 and transmitter aiming control 52 to allow the PTU 20 to direct the energy beam at the desired appliance.

It should be further recognized that the remote power system 1 may use various power beam frequencies or energy forms at one time. The power beam can incorporate different energy forms simultaneously or sequentially depending on the design of the energy beam converter. This allows a PTU 20 to use the energy form and frequency best adapted for the existing weather and/or atmospheric or other conditions at that time.

The PRS 44 comprises an energy receptor 54, an energy beam converter 11, an energy storage unit 13, a power usage monitor 16, a transmitter/locator or "translocator" unit 4 and a translocator antenna 26. Any or all of the energy receptor 54, energy beam converter 11, and translocator 4 and translocator antenna 26 may be physically located together, such as, for example, in the energy receptor 54 shown in FIG. 1. The energy receptor 54 may be mounted so that it can swivel or move as needed to align with the PTU 20 and maintain alignment in various appliance positions. Proper alignment of the energy receptor 54 with the power beam 5 maximizes the amount of energy that can be received by the PRS 44. Alignment may be achieved by logic control or manual manipulation of the energy receptor in a less sophisticated appliance.

The power usage monitor 16 is the main logic device for controlling power management inside the appliance. The power usage monitor 16 functions to monitor the amount of energy available to the appliance from the onboard energy storage unit 13. Preferably, the power usage monitor 16 also monitors the energy used by the appliance and the energy received from the PTU 20. When the energy available to the appliance falls below a predetermined level, the power usage monitor 16 activates the translocator 4 to request additional power from a PTU.

The activated translocator unit 4 initiates broadcast of a PRS communication signal 9 from the translocator antenna 26. The translocator 4 will preferably have two modes of operation. The first is a general communication mode that essentially scans the horizon, either 360-degrees around the appliance or some portion to either side of the appliance, to search for a PTU 20. If multiple PTUs are detected, the PRS 44 may select the strongest signal, or a signal in a direction of appliance travel. The translocator antenna 26 may be physically or electronically moved to implement this scanning function or could remain oriented in a single direction during broadcast in the general communication mode.

Once a particular PTU 20 is chosen, the translocator 4 changes from the general communication mode to a directional mode to provide a guide beam 6 with limited or controlled dispersion for the PTU 20 to follow. The PTU 20 locks onto and tracks the guide beam 6 to its source. Since, as shown in FIG. 1, the guide beam 6 is preferably sent from a translocator antenna 26 coaxially located with the energy receptor 54, the tracking signal unit 50, thereby locks onto the location of the energy receptor 54. Once the PTU 20 has located and locked onto the source of the guide beam 6, the transmitter aiming control unit 52 adjusts a power transmitter 22 to align with and focus on the energy receptor 54. Once aligned and focused, the power transmitter 22 initiates transmission of a directional power beam 5 to the energy receptor 54.

The power beam 5 is absorbed by the energy receptor 54 and transformed from the energy form of the power beam 5 to a form compatible with the energy storage unit 13 by the energy beam converter 11. In the embodiment of FIG. 1, the energy storage unit 13 is a battery. Alternate energy storage devices such as, for example, flywheel, ultra-capacitor, fuel cell conversion of water to $H_2$, etc can also be used in appropriate remote power systems. Energy stored in the energy storage unit 13 is used to power the various components of the appliance.

When the level of energy in the energy storage unit 13 rises above a predetermined level, the power usage monitor 16 signals the translocator 4, terminating or altering the PRS communication signal 9 to end power beam transmission. PRS-equipped appliances send a PRS communication signal to "call" for power when needed. Appliances are kept charged by wireless power delivery without human intervention, eliminating the need to remember to plug in the appliance for charging.

If the PRS communication signal 9 is lost by the PTU 20; or the power beam 5 or the PTU communication signal 19 is lost by the PRS 44, all communication between the PTU 20 and PRS 44 is considered lost, and the power unit controller 48 terminates power beam 5 transmission. A new communication link between the power transmitter unit and the PRS 44 would have to be established before restart of power beam transmission.

Figure 11A:
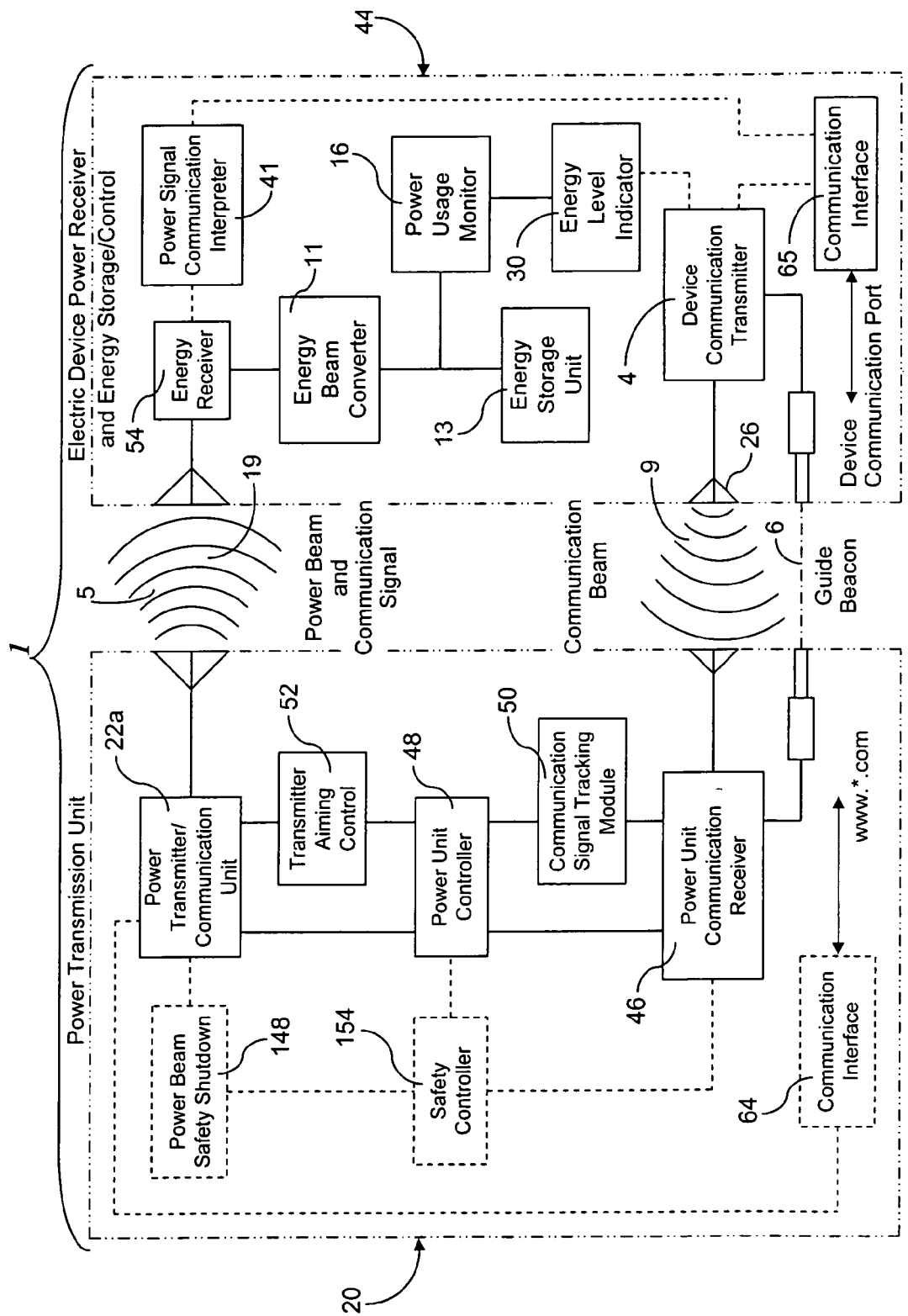
FIGS. 11A–11C are functional block diagrams illustrating embodiments of remote power systems according to aspects of the present invention.
Figure 11B:
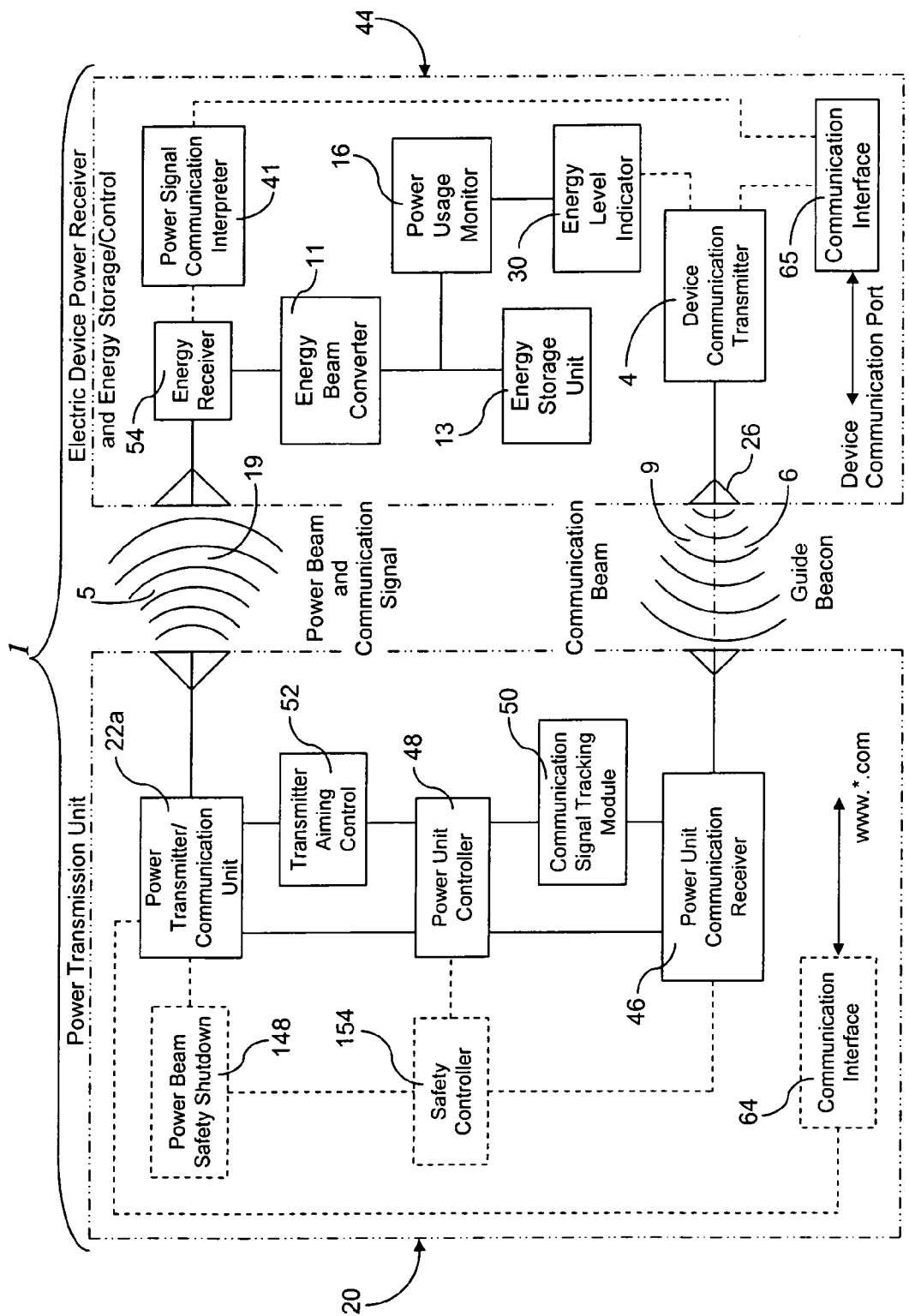
Figure 11C:
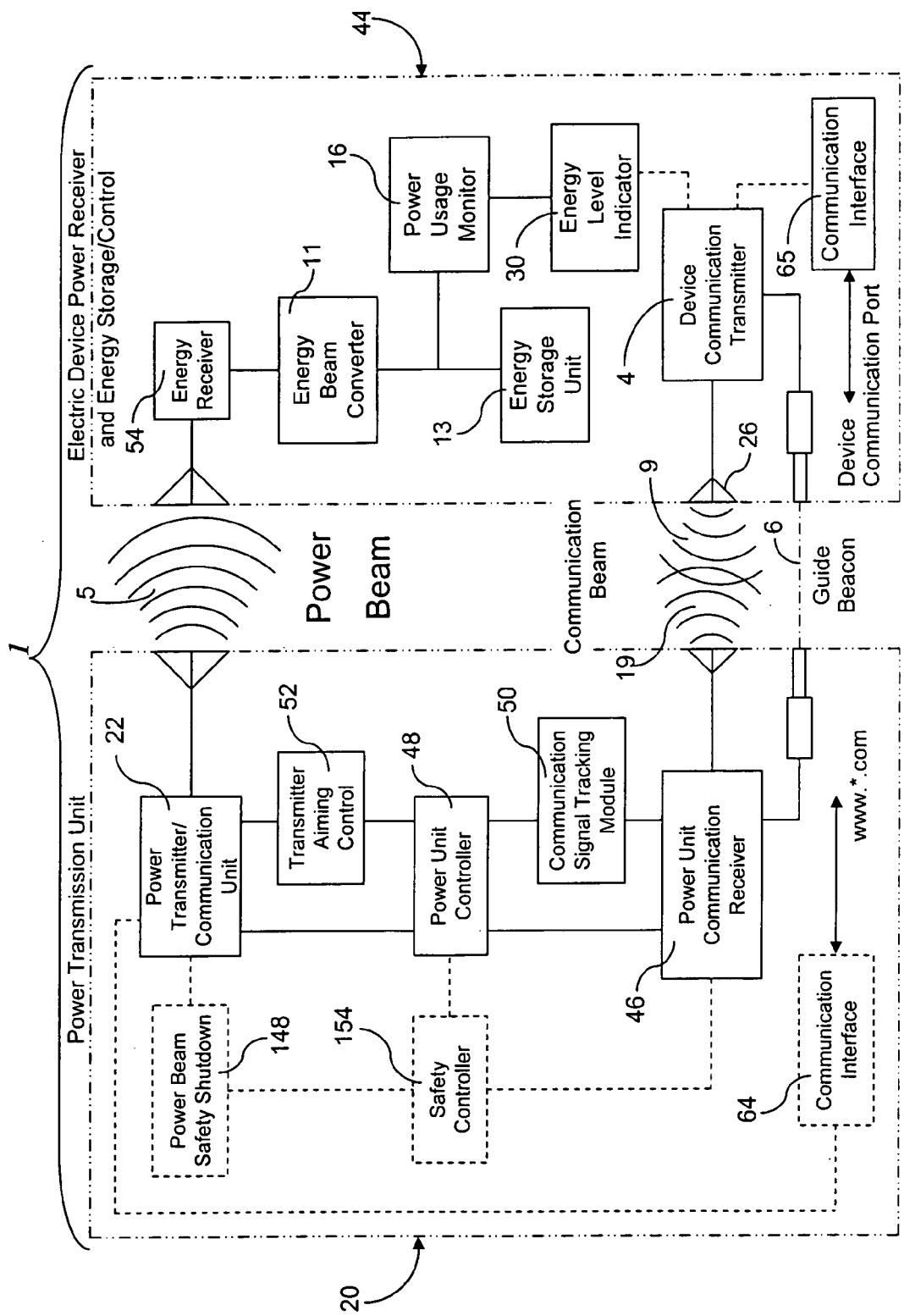

FIGS. 11B and 11C illustrate variations on the remote power system illustrated in FIG. 11A. In FIG. 11B, the PRS communication signal 9a to the PTU 20 also serves as the guide beam 6. The PTU communication signal 19 to the PRS 44 is included in the power beam 5. This remote power system 1 maintains the power transmission, two-way communications, and directional linkages using two wireless connections.

FIG. 11C illustrates a remote power system 1 in which the power beam 5 is dedicated to power delivery and serves no communications function except to deliver counted quantities of energy "packets". Two way communications between the PTU 20 and the PRS 44 are conducted by the translocator 4 and the power unit communication transceiver 46. A guide beacon 6 is generated by the translocator 4 to provide needed directional information to the PTU 20.

In those embodiments where the energy beam 5 is used to transmit data, the remote power system includes components for encoding data into the energy beam and for decoding the data from the energy beam. A combination power transmitter/communication unit 22a encodes the PTU communication signal 19 into the energy beam 5. The PRS 44 is provided with a power signal communication interpreter 41 to decode data carried by the energy beam 5. It should be recognized that the power beam 5 and PRS communication signal 9 can be of an entirely different frequency range and/or signal type.

An aspect of the present invention relates to three types of wireless linkages between the PTU 20 and the PRS 44. A wireless energy beam 5 is generated by the PTU 20 and directed at a PRS 44 to provide a wireless power transmission linkage. A translocator 4 associated with the PRS 44 generates a guide beacon 6 that is detected by the PTU 20 to provide a directional linkage. A one-way or two-way communications link between the PTU 20 and the PRS 44 is established by any of several methods described in greater detail below. Together, the power transmission, directional and communications linkages enhance the safety, capability and flexibility of the remote power system.

A particular aspect of the present invention relates to relationships between the three linkages. As discussed with respect to FIGS. 11A–11C, it is contemplated that the power transmission linkage can be utilized as a communications linkage from the PTU 20 to the PRS 44. Alternatively, a communications linkage from the PRS 44 to the PTU 20 can also be employed as a guide beacon. Thus, the PTU and the PRS 44 can be linked in three ways using as few as two wireless linkages as illustrated in FIG. 11B. Naturally, each of the three linkages may also be a discrete linkage with a single purpose as shown in FIG. 11C.

The power unit communication receiver 46 of FIG. 11A is configured to receive both a PRS communication signal 9 and a guide beacon 6 from the PRS 44. The power unit communication receiver 50 activates the power unit controller 48 in response to receipt of an appropriate request contained in the PRS communication signal 9. The power unit controller 48 is a logic type device that verifies the received signal 9 is a request for power transmission. In the embodiment of FIG. 11A, the PTU communication signal 19 is combined with the power beam 5 by a power transmitter equipped with components to encode data into the power beam. The power unit controller 48 activates the power transmitter/communication unit 22a to start transmission of a power beam 5 after verification. The power unit. controller 48 will also deactivate the power transmitter 22a to terminate power beam 5 transmission. In some embodiments, the power unit controller 48 acknowledges the appliance request in a PTU communication signal 19 sent from the power transmitter/communication unit 22a. Note that once a communications link has been established between the PRS 44 and the PTU 20 and power transmission has commenced, the PTU communication signal 19 may be augmented and/or replaced by the power transmission beam 5.

One function of a communications linkage between the PTU 20 and the PRS 44 is to allow the PRS 44 to request power from the PTU 20 and to permit identification of the PRS 44 to power provider companies for billing purposes. Another function of a communications linkage is to allow the remote power system to serve as a communications pathway from the appliance equipped with the PRS 44 and systems such as the Internet or telephone networks. FIGS. 11A–11C illustrate communications interfaces 64, 65 in the PTU 20 and PRS 44, respectively. The communications interface 64 in the PTU 20 is shown connected to the Internet. The communications interface 65 in the PRS 44 is connected to the appliance. The appliance is thus connected to the Internet by means of the two way communications link that is part of the disclosed remote power system 1.

The PRS and PTU communication signals 9, 19 and/or 6 preferably comprise a digital data stream. Digital data transfer provides a reliable means for accurately transmitting large amounts of data at high speed. This allows the PRS communication signal 9 to identify, for instance, a particular appliance to the PTU 20, thereby allowing verification of the request prior to the conductorless energy beam transmission. The use of a digital data stream allows the appliance to transmit other information, such as, for example, the amount of power received, the status and condition of the appliance, etc. Two-way communications allows communication with the appliance for providing instructions for pre-heating an oven, turning on lights, or activating an alarm system, etc. The data stream may be in the form of a coded or encrypted communication signal, to provide a secure communication between the PRS 44 and PTU 20, preventing tampering with the signal or theft of power. Additionally, the use of a communication signal 9, 19 and/or 6 comprising a data stream allows each appliance to be assigned a priority. For instance, high priority appliances could be given ultimate priority to preferentially receive any available power beams. Other uses for the communications linkage will be described below in the context of particular use environments.

In any embodiment of the present invention, the communication link between the PTU and the PRS can also contain data transmission between the two. That is, the power beam can be the signal carrying data to the application from the PTU. Therefore energy transmission can be sent and received not only as the power beam, but also as a data stream to the vehicle or appliance.

Then the "response" or return signal can be sent back from the appliance to the PTU as a data stream for communication as well as for guidance, location and acknowledgement of receipt of energy to the storage unit. This is shown clearly in FIGS. 11A and 11B where the power is also annotated as to Communication Signal, hence the data link from the power transmitting unit to the receiving unit.

Notice that the PTU has a "Communication Interface" 64 that ties the PTU into the Internet (World Wide Web) or any other communication system (cell phone, laptop, PDA, etc.) with the WWW.*.com notation on the Figures. Similarly, the PRS 65 has the notation "Device Commun.Port" that ties it into any data device. This again would be the means for the appliance to utilize the data stream (as a cell phone, laptop, PDA, etc.). There is no technical reason why the appliance or vehicle tracking system cannot use a data stream as the beacon to guide the power beam to the appliance. Similarly, the power beam can also be sent as a data stream, the energy bursts or packets sized as needed for sending data as well as for safety. Hence, in any embodiment of the present invention, a communication link can be, or is, a data stream link.

Operation of embodiments of the remote power system 1 according to aspects of the present invention will now be described in the context of a variety of use environments and in conjunction with alternative appliances. Specifically, FIGS. 1–7, 8–10, 20–24 and 31 illustrate the remote power system in conjunction with a variety of vehicles, including cars, busses, military hardware, aircraft and personal transport devices. FIGS. 25–30, 32 and 33 illustrate the remote power system in conjunction with alternative appliances including, but not limited to, cell phones, personal stereos, household appliances and outdoor appliances such as security system sensors, weather data and pumping stations. It will be understood that functions described in the context of a particular use environment or appliance are not limited to that use environment or appliance and are generally applicable to other use environments and other appliances.

FIG. 1 illustrates a remote power system 1 in block diagram form in the context of a motor vehicle 2 and also shows the preferred physical location in the energy receptor 54. When the PRS 44 is embodied in a surface vehicle (see FIGS. 11A–11C for PRS embodiment), the vehicle will also preferably comprise an operator control 14, a motor control unit 15, a motor 18, and regenerative braking system 17 that are interconnected with the PRS 44.

In conventional fashion, the operator control 14 allows the vehicle operator to control the motor through the motor control unit 15. The motor control unit 15 also controls the flow of energy from the regenerative braking system 17 contained in some embodiments to the energy storage unit 13. In a well known fashion, the regenerative braking system 17 converts the energy generated from slowing and stopping the vehicle into a form compatible with the energy storage unit 13 and transmits that energy through the motor control unit 15 to either the electric motor 18 or the energy storage unit 13. The motor control unit 15 further functions as an interface between the operator control 14 and the motor 18, as well as providing energy consumption data to the power usage monitor 16.

Communication between the vehicle 2 and the PTU 20 allows the vehicle 2 to be transferred from one PTU 20 to the next. As the vehicle travels, and the vehicle energy receptor 54 moves out of alignment or out of range of a first PTU, the first unit will terminate transmission of the power beam to the vehicle. The vehicle can establish communication with the next closest PTU and establish transmission of a power beam therefrom. In this manner, the vehicle can receive an almost constant supply of power from power transmission units along the vehicle route. Public transportation vehicles could be given a higher priority, to receive power beams before private vehicles, which may be assigned a lower priority. The use of a PRS communication signal 9 to transfer data to the PTU 20 also allows a stalled vehicle to be given a temporarily higher priority, allowing the stalled vehicle to be moved out of traffic.

In the context of the remote power system of FIG. 1, the PTU communication signal 19 and/or the energy beam 5, once established, can be utilized to transfer a data stream between the PTU and the vehicle 2. The data stream can include, for example, voice communications, data or other information. For example, the driver can receive calls and data from, for example, the Internet and/or be kept informed of local weather, road conditions, traffic information, etc. via the communications linkage between the PTU 20 and the vehicle PRS. Two-way communications between the PTU 20 and the vehicle PRS will allow, for example, the driver to initiate and receive calls, contact the Internet and/or be kept informed of local weather, road conditions, traffic information, etc.

Such communication and data transfer is especially useful in any embodiment where power transmission units are close together. In this situation a constant link with the vehicle can be maintained from power transmission unit to power transmission unit. This allows almost continuous communication between the vehicle and outside sources such as, for example, telephone calls or Internet access. This allows the vehicle driver and/or passengers to communicate with the outside world via the information communication signal transmitted by the power unit communication signal and/or energy beam and vehicle communication signal. This communications linkage can be provided for any type of vehicle connected to a remote power system 1. Line-of-sight communication would eliminate the typical "dead" spots that occur with existing cellular telephone and other present communication links that can be interrupted by buildings and other structures.

Figures 7, 7A:
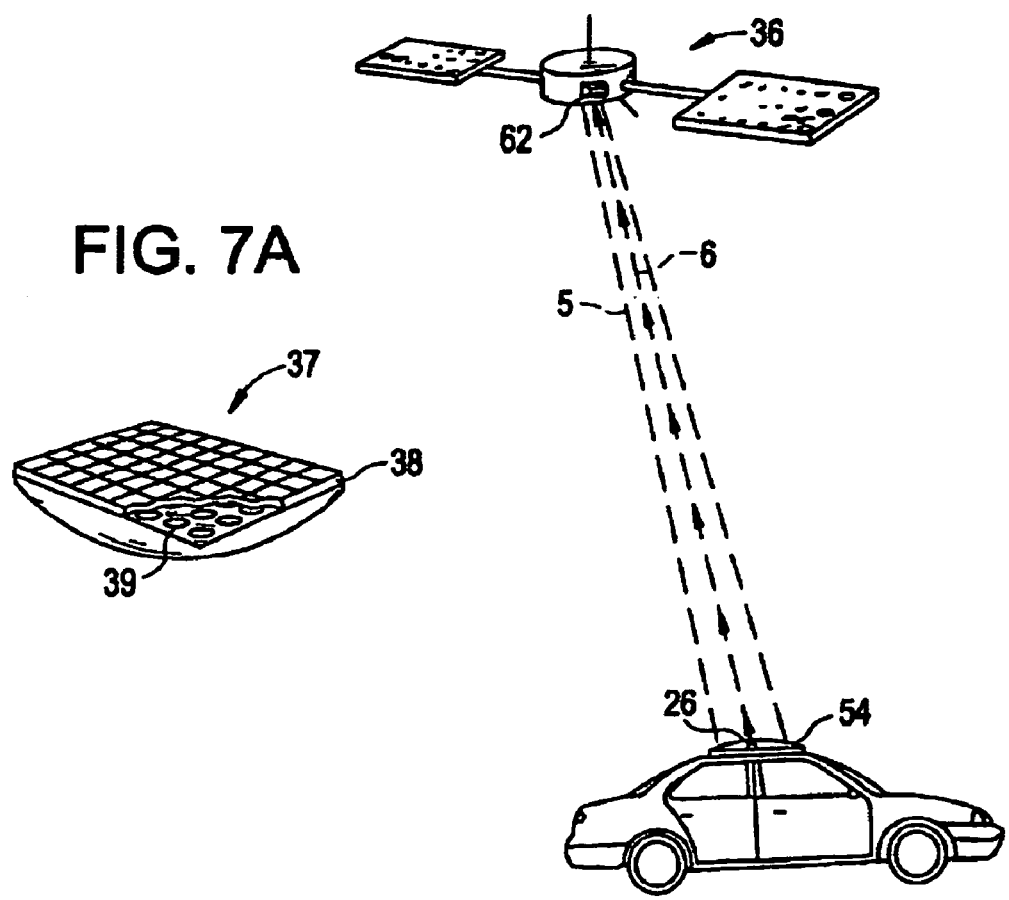
FIG. 7 is a graphical illustration of a satellite incorporating a PTU according to one aspect of the present invention.
FIG. 7A is a perspective view in partial section of a combination antenna according to one aspect of the present invention.

Referring to FIG. 7, there is shown a power transmission unit 62 located on satellite 36 for remote vehicle travel in rural parts of the country. In this embodiment, a vehicle incorporating a PRS 44 would have the mobility of an internal combustion engine vehicle, and the range (distance between translocator energy unit replenishment in vehicles so equipped) can be extended well beyond that of an internal combustion vehicle.

Figure 21:
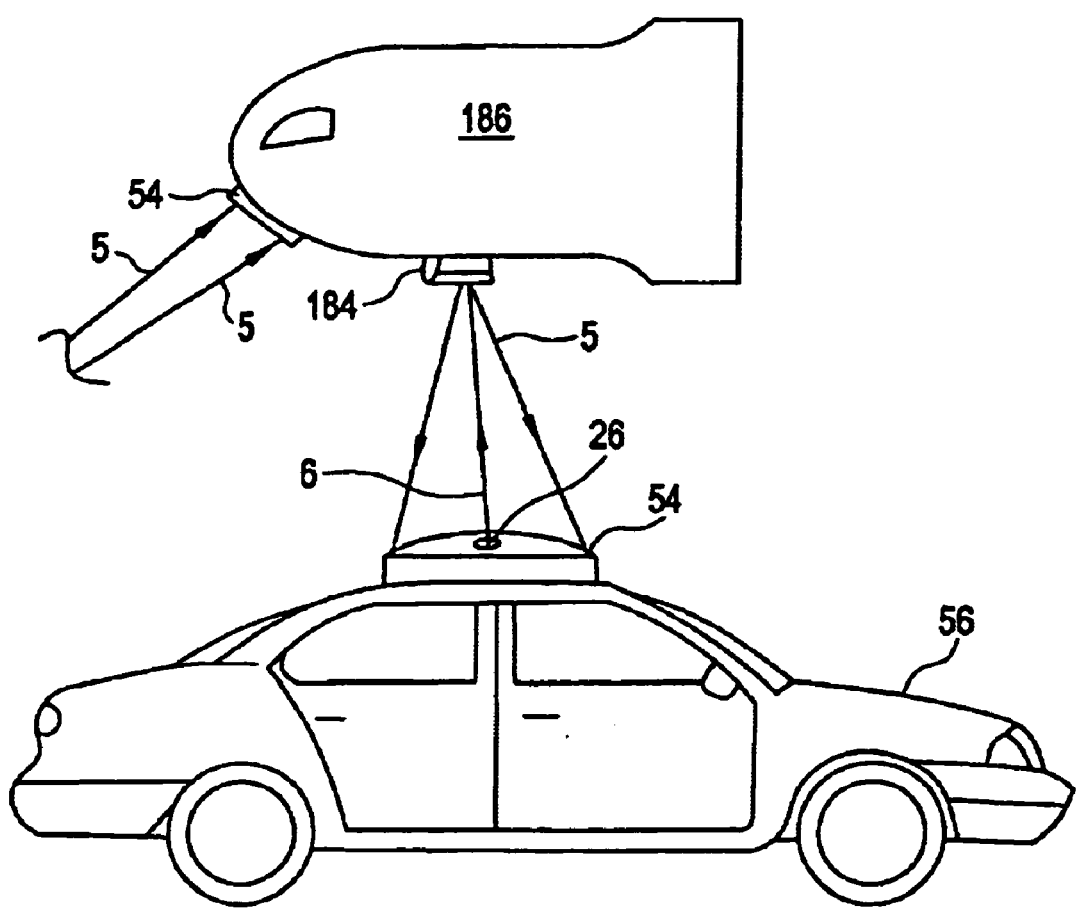
FIG. 21 is a schematic illustration of an embodiment of the invention with an airborne power transmission unit.
Figure 22:
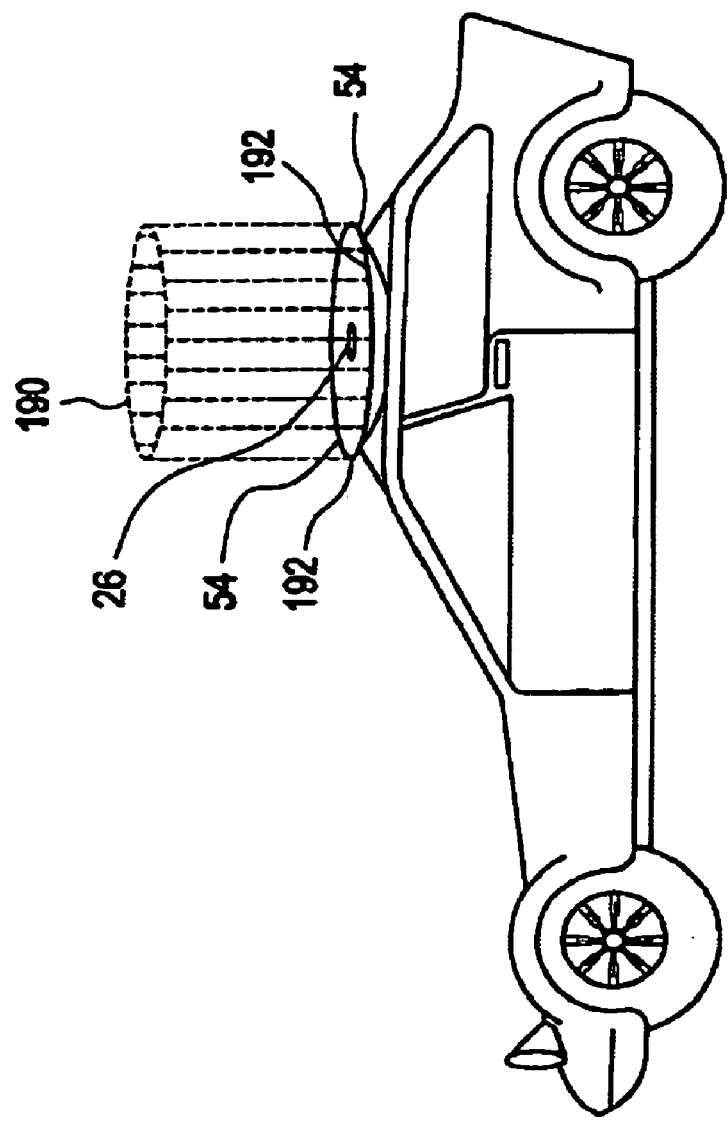
FIG. 22 is an embodiment of the invention incorporating a security zone.

FIG. 21 illustrates an embodiment of the remote power system 1 where the power transmission unit 184 is mounted to an airborne vehicle 186. As used herein, an airborne vehicle 186 comprises a balloon, blimp, dirigible, aircraft or other vehicle heavier or lighter than air and within the atmosphere. The power transmission unit 184 receives a vehicle guide beam 6 and transmits a wireless power beam to the source of the guide beam 6. The airborne vehicle 186 can include a power receptor 54 and PRS 44, for receiving a wireless power beam 5. Energy received by the airborne vehicle 186 is then distributed to the vehicle 56 below.

Figure 2:
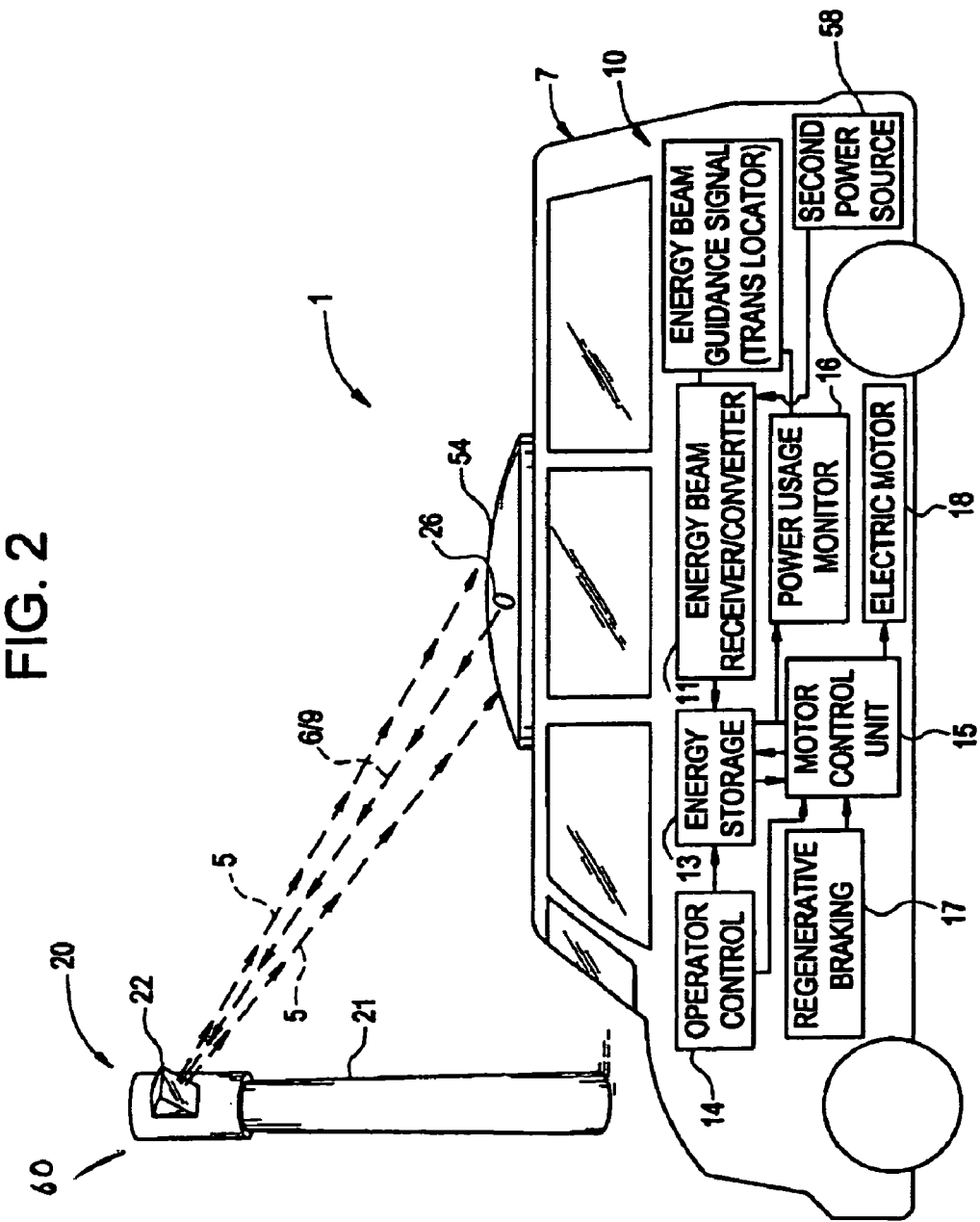
FIG. 2 is a schematic illustration of a hybrid vehicle incorporating an embodiment of the remote power system of the present invention.

Referring to FIG. 2, there is shown an embodiment of the present invention incorporated in a hybrid vehicle 7. The hybrid vehicle 7 includes a second power source 58 such as, for instance, an internal combustion engine or fuel cell. The hybrid vehicle 7 functions similarly to the vehicles 2, 56 described above except the inclusion of the second power source 58 allows the vehicle 7 to be operated in cases where a PTU 20 is not encountered. When the power usage monitor 16 senses that the level of energy in the energy storage unit 13 is below a predetermined level, the second power source 58 is operated to generate energy which is in turn stored or used by the motor.

Another aspect of the invention is the use of a hybrid energy storage system. The hybrid energy storage system comprises a rapidly chargeable short term energy storage device and a more slowly chargeable long term energy storage device. One very distinct advantage to a hybrid energy storage system is the capability of storing a large quantity of energy very rapidly, then putting this large volume of rapid recharge energy into a long-term, more reliable storage media. For example, an ultracapacitor can store a very large amount of electrical energy in a very short time, but loses the full charge in a few days. The same is true for a flywheel. The flywheel may not be as quick to store energy as the capacitor, but similarly loses the stored energy in a few days. On the other hand, devices such as a storage battery or fuel cell can store energy for a very long period of time (months or even years), but requires a much longer time period to receive, absorb and store that energy.

Therefore, in an embodiment of the invention using a hybrid energy storage system a moving vehicle can be in the vicinity of a PTU for a few seconds and store a very large amount of energy in a rapid charge short term energy storage device, for example an ultracapacitor or flywheel. Then, as the vehicle continues down the road, this quick charged energy is transferred through a controller into a long-term storage device, for example a battery; i.e., the quick charge storage device provides a trickle charge for the battery. This will greatly improve the operation and effectiveness of the overall system.

Figure 24:
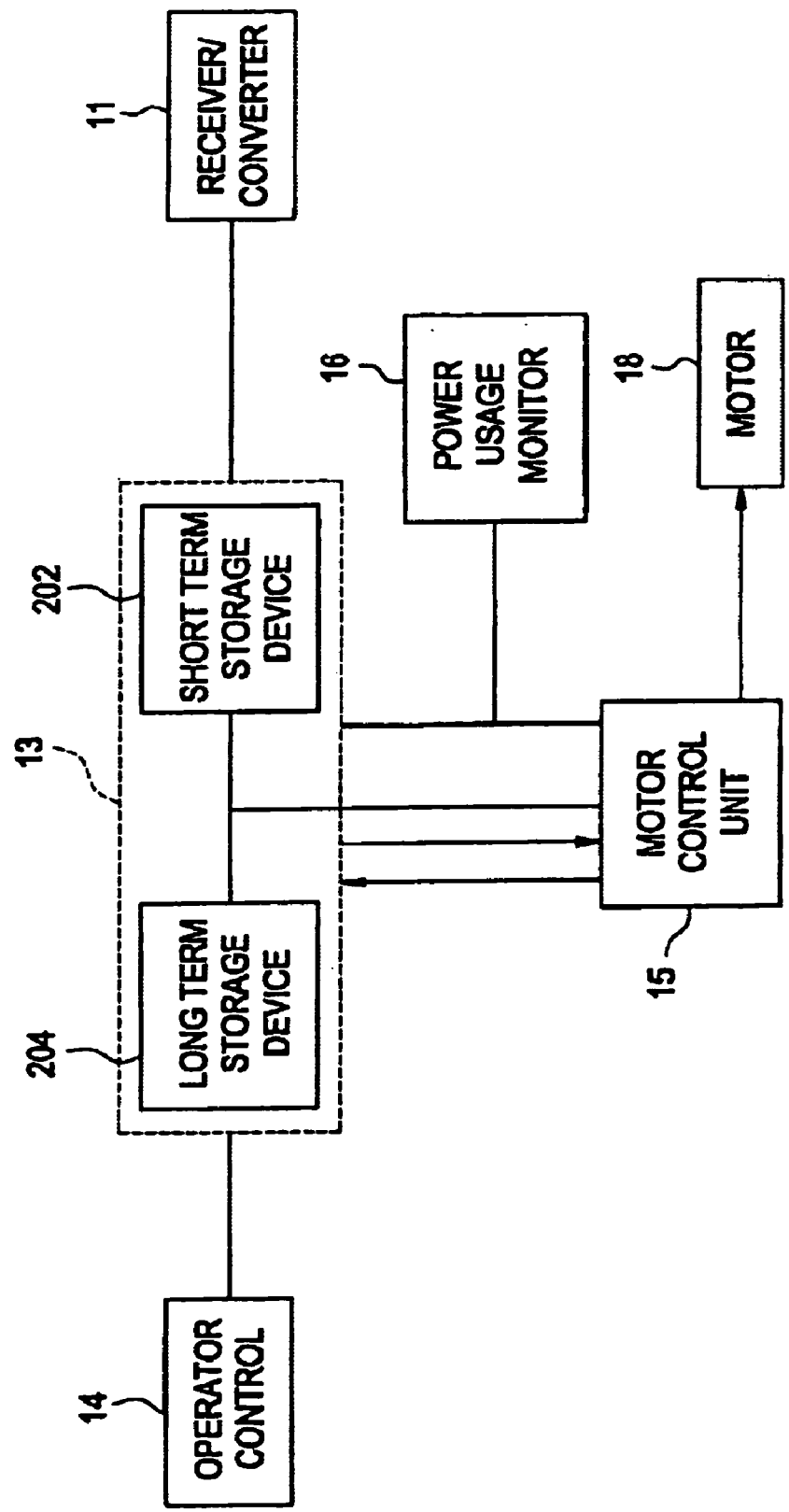
FIG. 24 is a schematic diagram of an embodiment of a hybrid energy storage system for a vehicle.

In one embodiment, a quick charge storage device can supply energy through the motor control unit 15 directly to the drive motor if the driver needed a "burst" of energy to pass another vehicle. The quick charge storage device may both supply power to the drive motor and trickle charge the battery simultaneously. Alternately, the energy from the quick charge storage device can be slowly added to the battery or other storage system if passing power is not needed. In this way, once the vehicle is parked, the quick charge storage device can discharge to the long term storage device in a controlled, timely and efficient manner without fear of losing the energy stored in the quick charge storage device. FIG. 24 shows a schematic diagram of an embodiment of the hybrid storage scheme. The quick charge storage device 202 can be, for example, an ultracapacitor or flywheel, while the long-term device 204 can be, for example, a battery or fuel cell energy storage. The controller in this embodiment is part of the motor control unit 15. Power to the drive motor 18 can come from either the short-term energy storage unit or the longer-term energy unit, depending on the desired control scheme.

Figure 3:
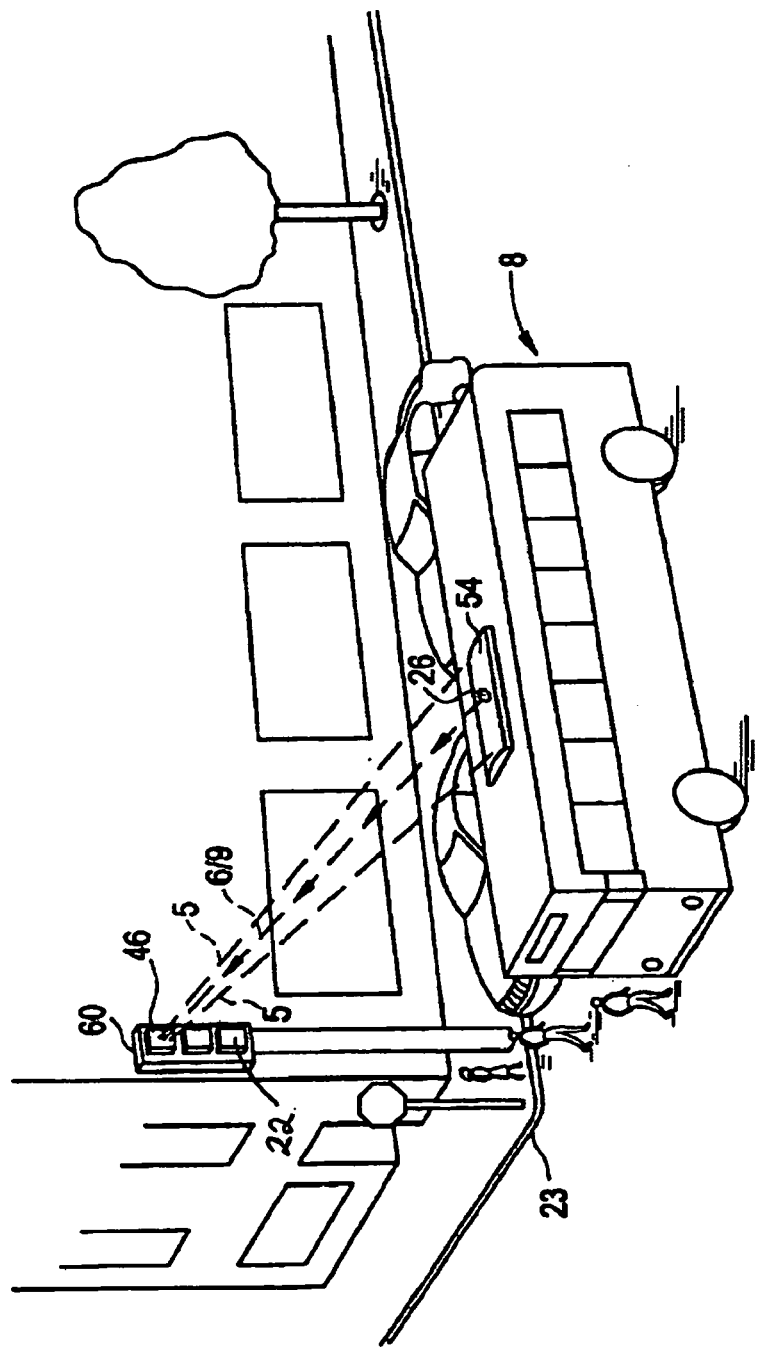
FIG. 3 is a perspective illustration of an embodiment of the present invention incorporated in an urban setting.

Referring to FIG. 3 there is shown a public transportation system utilizing an embodiment of the present invention. A bus 8 is shown stopped at a corner 23 of a typical city street, which includes power transmission unit 60. The bus includes an embodiment of the PRS 44 described above. While stopped for discharging and loading of passengers, the power usage monitor 16 (not shown in FIG. 3) activates the translocator 4 to transmit a PRS communication signal 9 from the translocator antenna 26. The PRS communication signal 9 is received by a power unit communication receiver 46, which signals the power unit controller to lock onto the source of PRS communication signal 9 and initiate transmission of the power beam 5 from the power transmitter 22 to the bus energy receptor 54. The PRS communication signal 9 functions as a guide beam 6 to provide directional linkage between the bus 8 and the PTU 60. In this typical operation there is no interruption of service to the bus 8 or passengers. The benefit over many prior art systems is also illustrated in FIG. 3. Because cars are parked at the curb there would be no possibility for a charging system mounted in the curb or roadbed, such as an induction system, to charge the storage unit of the bus. With the inventive remote power system 1 described, the energy storage unit of the bus 8 is charged by the PTU at any location within range of the power beam 5.

Figure 4:
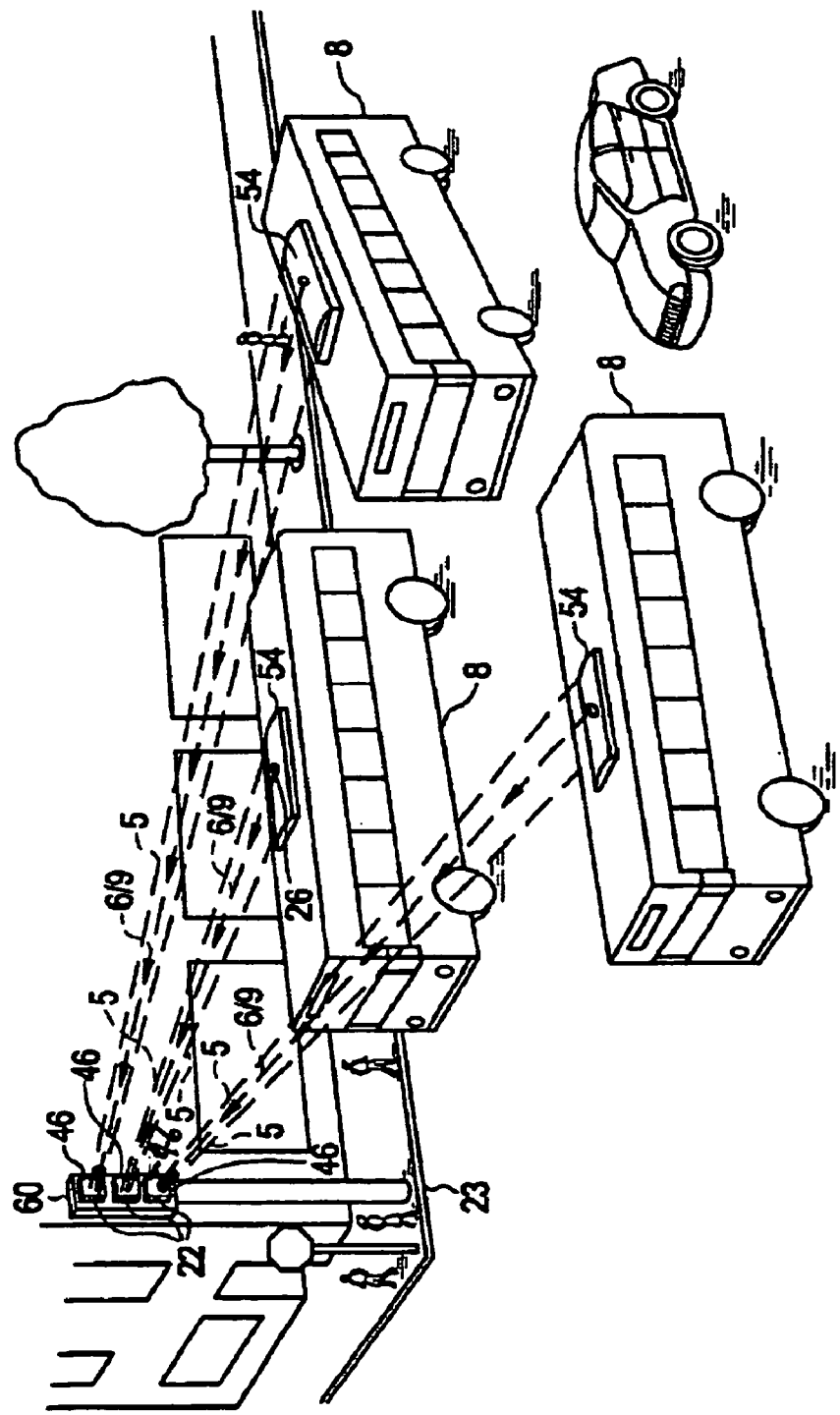
FIG. 4 is a perspective illustration of an embodiment of the present invention incorporated in an urban setting.

FIG. 4 shows three buses 8 located near the street corner 23. In this embodiment all three buses are receiving energy in the form of separate power beams 5 while they are in the intersection. In this embodiment, the power transmission unit 60 comprises multiple power transmitters 22 and communication devices 46. It would also be possible for the remote power system 1 to sequentially transmit multiple power transmission beams 5 from a single power transmitter 22.

In the setting shown in FIG. 4, any one of the three buses could change position with any of the other buses and there would be no difference as far as power beams 5 are concerned. The first bus 8 that arrives in range of the PTU 60 establishes communications with a communication device 46. The second bus 8 that arrives in range of the power transmission unit 60 establishes communications with the next available communication device 46, and so on. A priority system can be set up so that the power transmitters 22 are activated in a particular order, and the order can be rotated so that each transmission unit 22 is utilized for the same amount of time. Encoded PRS communication signals 9 allow the PTU to identify and track vehicles as they move to maintain communication and power transmission linkages with the vehicles while they are in range of the power transmitters 22.

It is anticipated that a plurality of PTU can "hand off" vehicles from one PTU to another. In this manner, a first PTU ends power transmission to, and hands off the vehicle communication signal from, a first vehicle to a second PTU. The second PTU locks onto the vehicle communication signal and commences transmission of the power beam. It is also possible for PTUs to "trade" or "swap" vehicle communication signals among each other. In any of these embodiments, the crossing of transmitted power beams, and the resulting destructive interference, are eliminated by capacity to identify and track individual vehicles.

Figure 5:
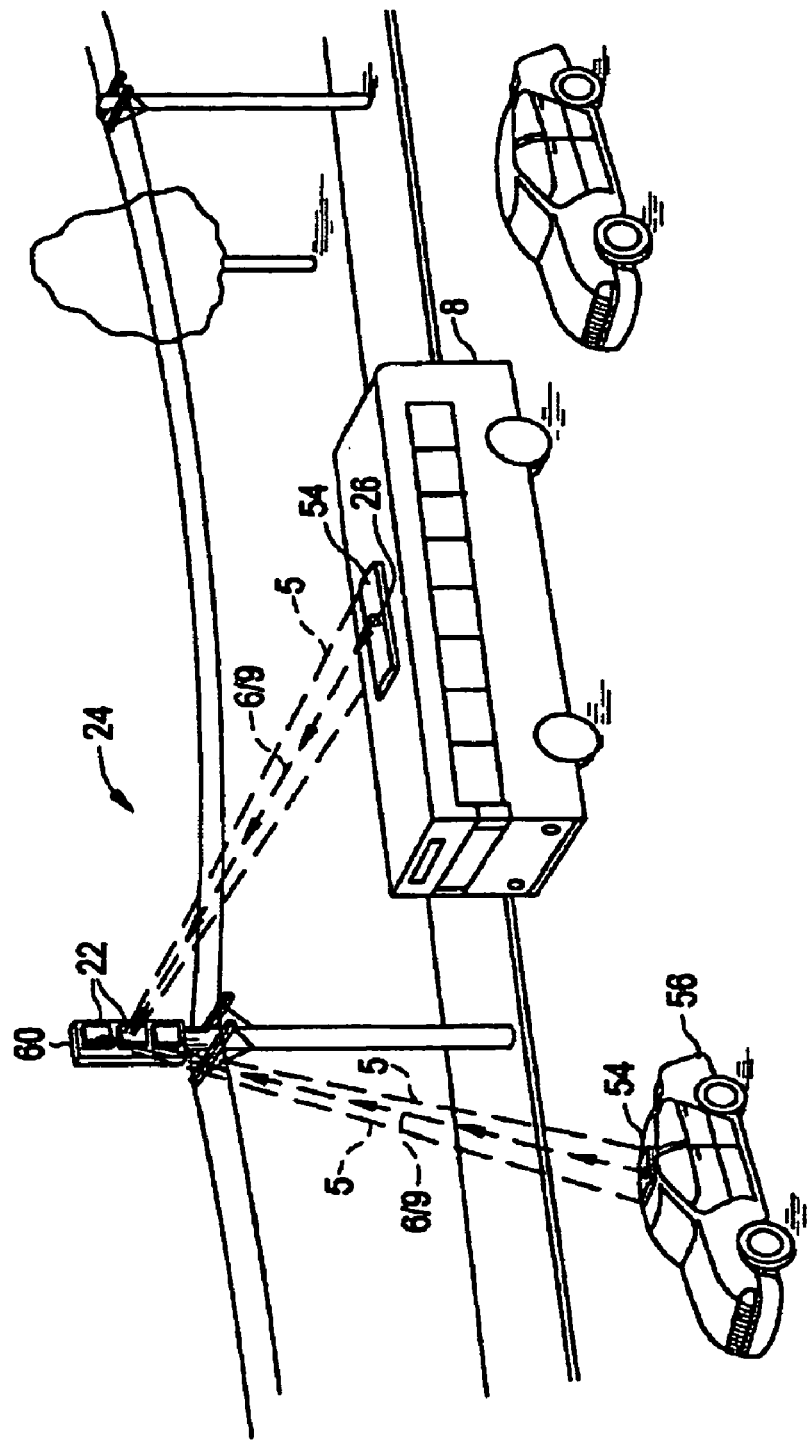
FIG. 5 is a perspective illustration of an embodiment of the present invention incorporated in a rural setting.

FIG. 5 illustrates a remote power system 1 according to aspects of the present invention incorporated into a typical rural street setting 24. Both the car 56 and the bus 8 include a PRS 44. As the car 56 and bus 8 move along the road, the PTU 60 receives both PRS communication signals 9. The PRS communication signal 9 is used as a guide beam, allowing the PTU 60 to lock onto the source of each of the signals and start transmission of a directional power beam 5 to receptors 54 on both the car 56 and bus 8. The power beam transmissions continue until a vehicle is either fully charged, or the vehicle travels beyond the range of the PTU 60, at which time the PRS communication signal 9 will be altered or ended.

Figure 6:
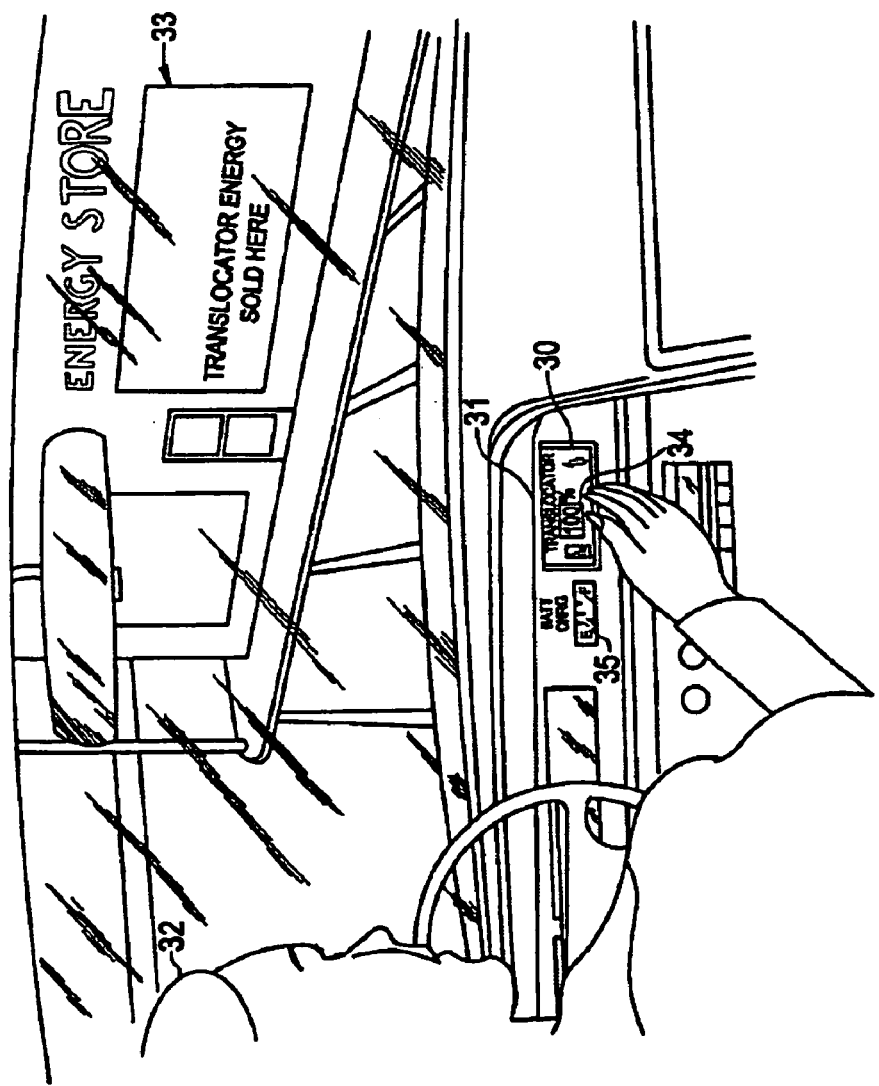
FIG. 6 is a perspective illustration of an embodiment of a translocator energy unit incorporated in a vehicle.

FIG. 6 illustrates an embodiment of a translocator energy unit of the present invention as incorporated in the dashboard 31 of a vehicle. The translocator energy unit 30 is a replenishable meter operably connected to the power usage monitor 16. The translocator energy unit 30 must contain energy credits for the translocator 4 to transmit a signal 6 to a PTU 20 requesting a power beam 5. As the PRS 44 receives energy from the power beam 5, a corresponding amount of energy credits are subtracted from the translocator energy unit 30. The vehicle operator 32 can replenish the empty translocator energy unit 30 as by, for instance, removing the unit 30 from the dashboard and delivering it to a consumer outlet 33. The operator 32 remits payment to the consumer outlet 33 corresponding to a certain amount of wireless energy. The consumer outlet 33 replenishes the translocator energy unit 30 to a level of energy credits corresponding to the amount of energy purchased. With the replenished translocator energy unit 30 reinstalled in the vehicle, the translocator 4 will transmit a PRS communication signal 9 and the vehicle will receive a power beam 5 from any PTU 20 until the corresponding amount of energy in the translocator energy unit 30 is again exhausted.

The vehicle operator 32 may also use a replenishable (or throw-away) cash card purchased at the consumer outlet 33 to "refill" the vehicle's energy storage unit. Or the operator could swipe a personal credit card in a reader to purchase more energy. Any type of electronic device available to consumers to transfer funds for more energy units is possible.

In some embodiments the translocator energy unit 30 also includes a metered readout 34 which corresponds to the level of energy units remaining in the unit 30. Also, shown in FIG. 6 is energy storage unit meter 35 which is a graphical readout corresponding to amount of energy remaining in the vehicle energy storage unit 13. By way of example, the amount of energy credit available in the translocator energy unit 30 could allow the vehicle to travel 400–500 miles, the equivalent of about one tank of gasoline in typical internal combustion powered passenger vehicle and many times the range of commercially available electric vehicles.

Since the power beam 5 may comprise a number of different energy forms, the vehicle receptor 54 and energy beam converter 11 are capable of variation to best utilize the chosen power beam energy form. For example, the receptor 54 could be a large surface area design similar to FIGS. 1 and 2 with the power beam 5 focused over substantially the entirety of the receptor area, lowering the energy density of the power beam. Of course, the distance between the power transmitter 22 and the receptor 54 will affect the focus of the beam 5 or how much it "spreads", and therefore the resulting beam energy density at the vehicle receptor 54. The beam focus and therefore the energy density will change as the vehicle 56 approaches toward, and then departs from the power transmitter 22. This change in the focus of the power beam 5 can easily be accounted for and corrected by the transmitter-aiming device 52.

For a radio frequency power beam, the energy receptor can be a rectifying antenna, or "rectenna" 38. Shown in FIG. 7A is an embodiment of a combination energy receptor 37. The combination energy receptor 37 includes rectenna 38 overlying a solar panel 39. The rectenna 38 is positioned in the upper surface of the combination energy receptor 37 and is comprised of a rectifying antenna to receive and absorb power beam transmission in the form of RF energy. By contrast the solar panel 39 is mounted in the lower portion and adapted to capture and absorb power beam transmission in a different form such as a columnated or laser energy form. The rectenna 38 is essentially transparent to laser energy forms; thereby allowing the vehicle to receive power beams 5 of either type. Because of the narrow bandwidth of laser energy, the combination energy receptor 37 may be advantageously suited to city use.

Figure 7B:
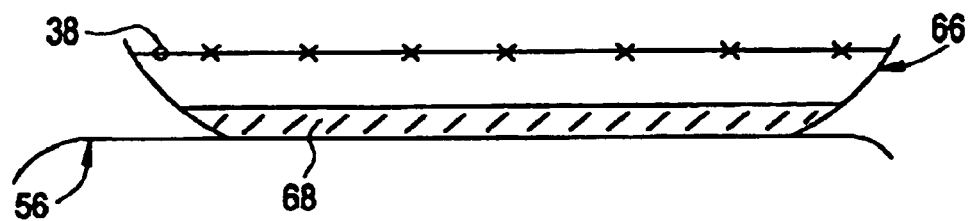
FIG. 7B is a partial cross sectional view of an aspect of the invention showing a single rectenna mounted on a vehicle with insulation between the rectenna receiver and the vehicle interior.

FIG. 7B illustrates a single rectenna 38 within a receiver case 66 mounted on a vehicle 56. This embodiment includes a layer of microwave insulative material 68 disposed between the rectenna 38 and the interior of the vehicle 56. The insulation 68 will absorb and dissipate the excess or waste microwave energy that is not absorbed by the rectenna 38. The insulative material 68 can be a ceramic material such as, for instance, alumina or beryllia having a high absorptivity for the energy beam and a surface finish suited for energy absorption. Alumina can have an absorptivity of 0.94, which approaches the value of 1.0 for an ideal absorber.

Figure 7C:
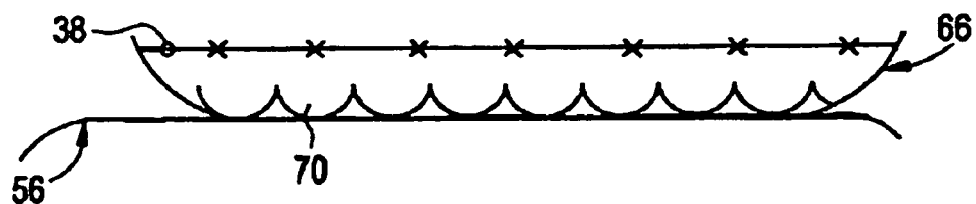
FIG. 7C is an embodiment of the invention similar to FIG. 7B wherein the insulation is replaced by a reflective element.

FIG. 7C illustrates a single rectenna 38 within a case 66 mounted on a vehicle 56. This embodiment includes an energy reflective surface 70 disposed between the rectenna 38 and the interior of the vehicle. Reflective surfaces are well known in the art, being used extensively in, for example, microwave devices to channel microwaves to a chamber or region for use. The reflective surface 70 will reflect the excess or unabsorbed energy back through the rectenna 38 for a second opportunity at absorption. If not absorbed in the second pass, the energy is directed upwards into the atmosphere where it will dissipate harmlessly.

Figure 7D:
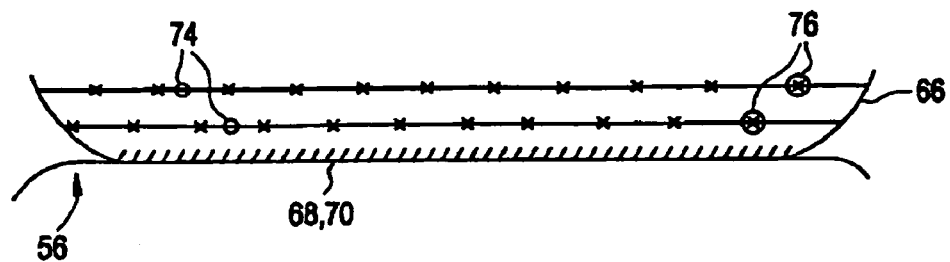
FIG. 7D is a partial cross sectional view of an aspect of the invention showing a multi-tier rectenna arrangement.

FIG. 7D illustrates a multi-tier rectenna 74 within a case 66 mounted on a vehicle 56. The rectenna 74 includes overlying rows of diodes 76. Preferably, the diodes 76 in each row are staggered with respect to diodes in other rows to improve energy absorption. The two-tier rectenna 74 shown in FIG. 7D allows for energy absorption at both the primary and secondary level. Naturally, rectennas with more than two layers are also possible.

Figure 7E:
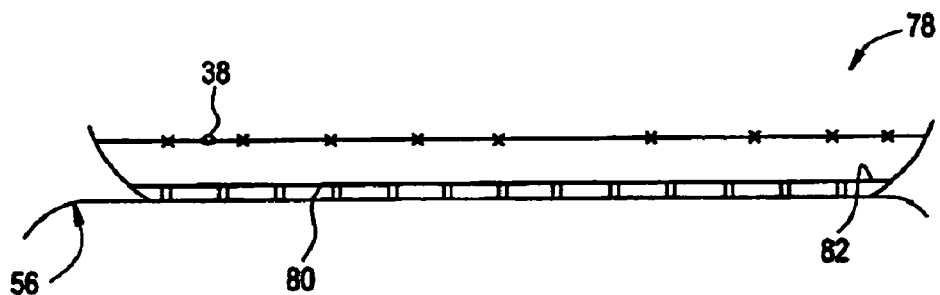
FIG. 7E is a partial cross sectional view of a combination energy receptor according to one aspect of the invention.

FIG. 7E illustrates a combination energy receptor 78 combining a rectenna 38 overlying a direct energy conversion device 80. For example, the direct energy conversion device 80 may be a thermoelectric generator or thermionic power generator. With this combination energy receptor 78, energy that is not absorbed by the rectenna 38 strikes the conversion device 80, heating the device. The conversion device 80 converts the heat to electric power, which is utilized in the PRS 44. An energy absorbing surface 82 can also be disposed between the rectenna 38 and conversion device 80 and in thermal contact with the device 80. The surface 82 is preferably a high temperature ceramic material such as alumina coated to increase absorption of energy. The unabsorbed energy passes through the rectenna 38 and strikes the energy absorbing surface 82, thereby heating the surface 82. Heat from the surface 82 is transferred to the conversion device 80, where it is converted into electrical energy for utilization by the PRS 44.

Figure 7F:
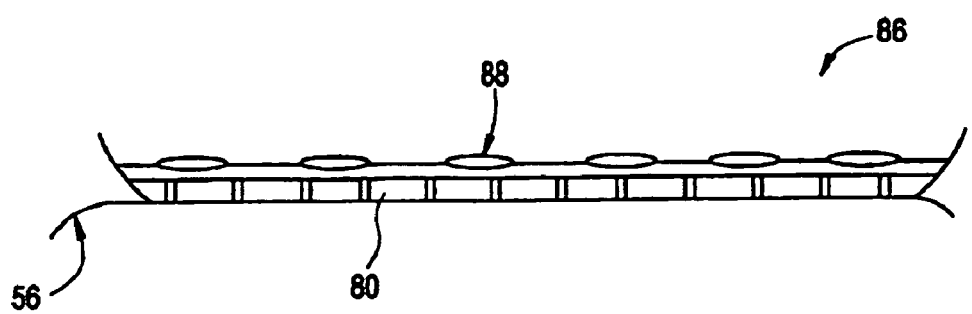
FIG. 7F is a partial cross sectional view of a combination energy receptor according to one aspect of the invention.

FIG. 7F illustrates a combination energy receptor 86 combining a plurality of photovoltaic cells 88 overlying a direct energy conversion 80 device. For example, the photovoltaic cells 88 may overlie a thermoelectric generator. With this energy receptor 86, thermal energy produced in the photovoltaic cells 88 is converted by the conversion device 80 to electric power, which is utilized in the PRS 44. With this energy receptor design the power beam 5 is preferably focused to provide high energy density. A high energy density power beam is scanned or "dithered" over a substantial portion of the energy receptor 86 surface to improve energy transfer.

Any of the energy receptor designs may also include either or both of the reflective layer 70 to increase energy absorption and/or the insulative layer 64 to shield the vehicle 56 interior from stray energy.

Figure 12:
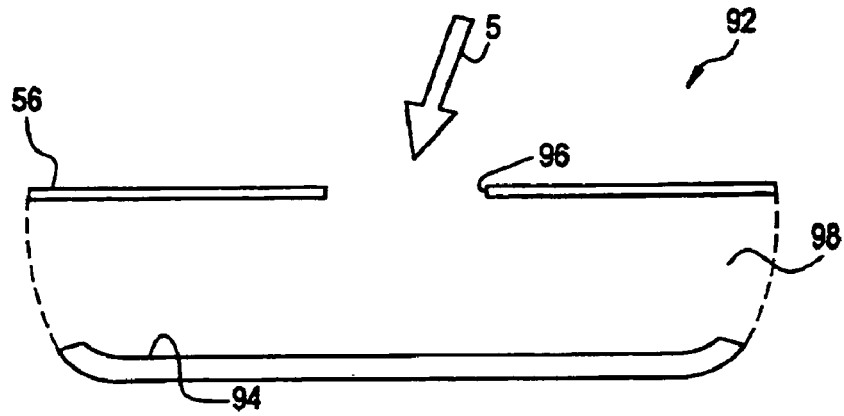
FIG. 12 is a partial cross sectional view of an aspect of the invention showing an enclosed energy receptor.

Alternatively, with a highly focused power beam 5, such as, for instance, a laser beam, the energy receptor 54 could be an enclosed vehicle receptor or an enclosed vehicle receptor and power beam converter 92 as shown in FIG. 12. The enclosed receptor and converter 92 could comprise an enclosed conversion device 94 with a relatively small inlet or aperture 96 connecting an enclosed cavity 98 with the outside environment. The power beam converter is contained within the cavity 98. All of the energy from the power beam 5 is focused for entry through the inlet 96 and contained within the device 92. With all the radiant energy absorbed internal to the energy converter 92, radiative energy leakage is not a concern and the safety of passengers and passersby is heightened. The enclosed receptor and converter 92 is mounted on or within a vehicle and is operably connected to the PRS 44.

Figure 12A:
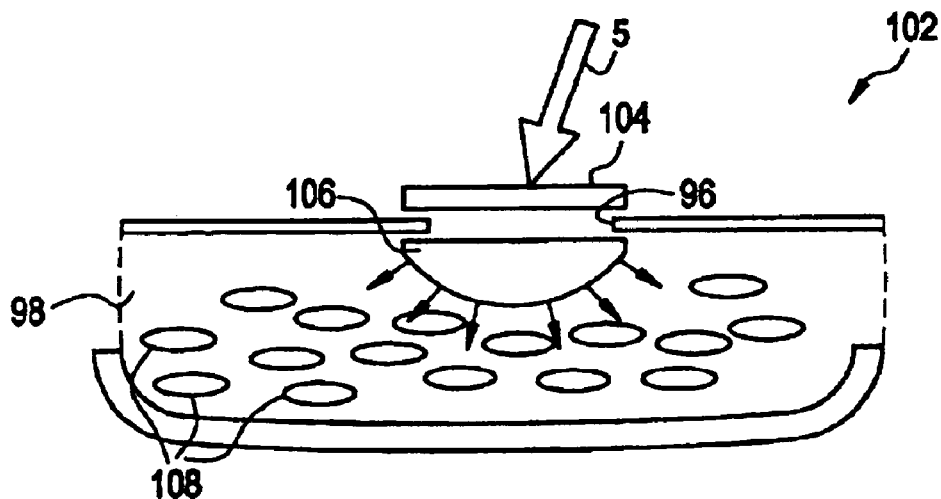
FIG. 12A is a partial cross sectional view of another embodiment of the invention showing an enclosed energy receptor.

FIG. 12A illustrates an enclosed receptor/converter 102 for use with a highly focused power beam 5. The receptor/converter inlet 96 includes a window 104. Preferably the window is spectral, that is the window allows only the specific wavelengths of the power beam 5 to pass through. The beam 5 strikes a dispersion lens 106 that distributes the beam 5 over the full array of photovoltaic cells 108 arranged over the interior wall of the enclosed cavity 98. The dispersion lens 106 and window 104 minimize the escape of energy from the cavity 98, thereby minimizing energy leakage to the environment and increasing converter 102 efficiency.

Figure 12B:
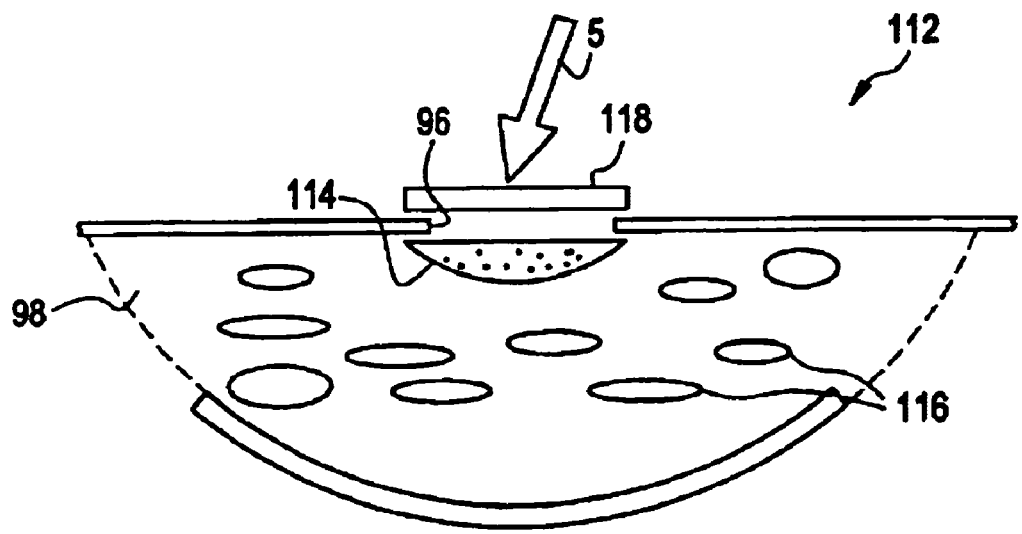
FIG. 12B is a partial cross sectional view of another embodiment of the invention showing an enclosed energy receptor.

FIG. 12B is a different embodiment of an enclosed receptor/converter 112. In this embodiment a high temperature filament plate 114 is disposed adjacent the inlet 96 and a plurality of thermophotovoltaic cells 116 are arrayed over the interior wall of the enclosed cavity 98. Typical thermophotovoltaic materials include gallium antimonide and indium gallium arsenide. The filament plate 114 is constructed of a ceramic material resistant to high temperatures, such as, for example, silicon carbide. Naturally, different temperature resistant materials having spectral and radiative properties matching the optical requirements of the specific thermophotovoltaic cells will improve converter 112 efficiency. Energy from the power beam 5 (which may be columnated light, microwave, electron beam or other form) enters the inlet 96 and heats the filament plate 114. Preferably, the filament plate 114 is heated in excess of 800° C. A window 118 limits radiative heat transfer leakage from the cavity 98 and protects the heated filament plate 114. The heated filament plate 114 radiates energy to the thermophotovoltaic cells 116, which produce electricity for use by the PRS 44.

Figure 13:
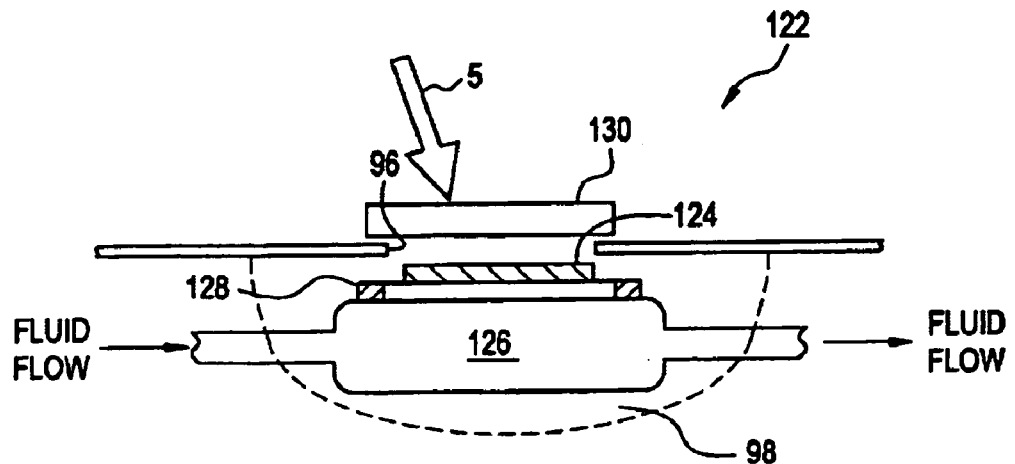
FIG. 13 is a partial cross sectional view of another embodiment of the invention showing an enclosed energy receptor.

FIG. 13 is a different embodiment of an enclosed receptor/converter 122. In this embodiment, an energy receiver plate 124 and a boiler 126 are in heat transfer relationship. The combination is contained within the cavity 98 with the energy receiver plate 124 adjacent the inlet 96. The energy receiver plate 124 is highly absorbent to the power beam 5 energy form and efficient at converting absorbed energy to heat. The energy receiver plate 124 is typically of ceramic construction and similar in size to the inlet 96 opening. The power beam 5 strikes the energy receiver plate 124 that absorbs energy from the power beam 5 and is heated thereby. The energy receiver plate 124 transfers heat to the boiler 126. A working fluid flowing through the boiler 126 is heated and the heated fluid is utilized to propel the vehicle. As used herein, "working fluid" refers to any solid, liquid gaseous or other material that converts thermal energy to power. A working fluid may, but is not required, to undergo a phase change to convert thermal energy to power. A window 130 over the inlet 96 limits radiative leakage from the cavity 98.

Preferably, the energy receptor 122 of FIG. 13 includes a thermal conduction dispersion plate 128 physically disposed between the energy receiver plate 124 and the boiler 126 and in heat transfer relationship with both. The energy receiver plate 124 transfers heat to the physically larger thermal conduction dispersion plate 128, which in turn heats a substantial portion of the boiler 126. The thermal conduction dispersion plate 128 functions to enhance heat transfer from the energy receiver plate 124 to the boiler 126, allowing the use of a smaller energy receiver plate 124 and inlet 96.

Figure 20:
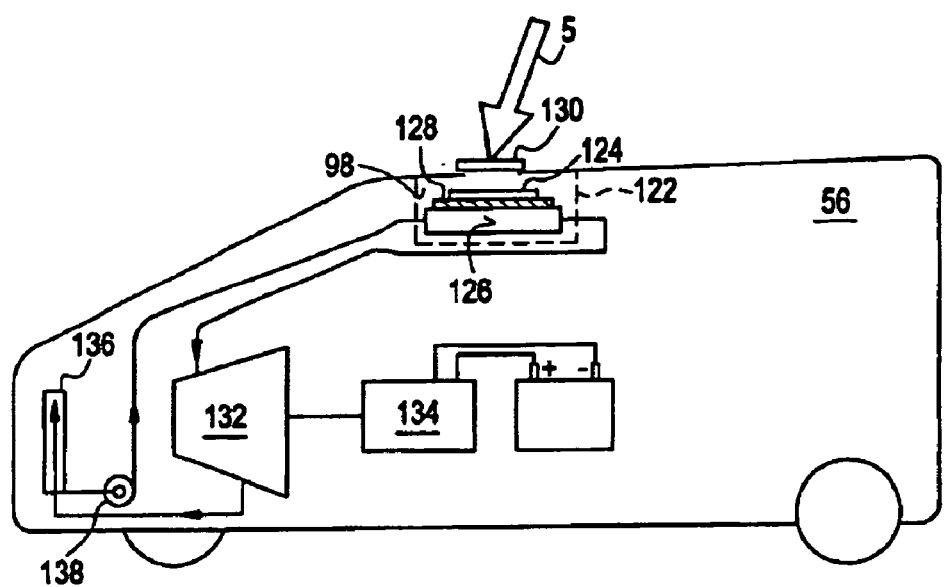
FIG. 20 is a schematic illustration of a vehicle incorporating an embodiment of the remote power system with an enclosed energy receptor.

FIG. 20 illustrates an embodiment of the remote power system 1 using an enclosed energy receptor/converter 122 mounted to a vehicle 56. The power beam 5 is converted into thermal energy within the converter 122. The thermal energy within the converter 122 is used to heat a working fluid. While many working fluids are known, water as a working fluid may be heated in an appropriate system to low or high pressure steam. The heated working fluid functions to drive a conversion device 132, such as a turbine. In the embodiment of FIG. 20, the turbine drives a generator 134, which produces electricity for use in the PRS 44. After use in the turbine, the fluid is cooled within a radiator 136 and moved by pump 138 back to the converter 122. It should be noted that while not shown, the turbine could also store energy in a flywheel, ultracapacitor or be used to provide motive power through a conventional drive train utilizing well known components such as a transmission and differential.

Figure 14:
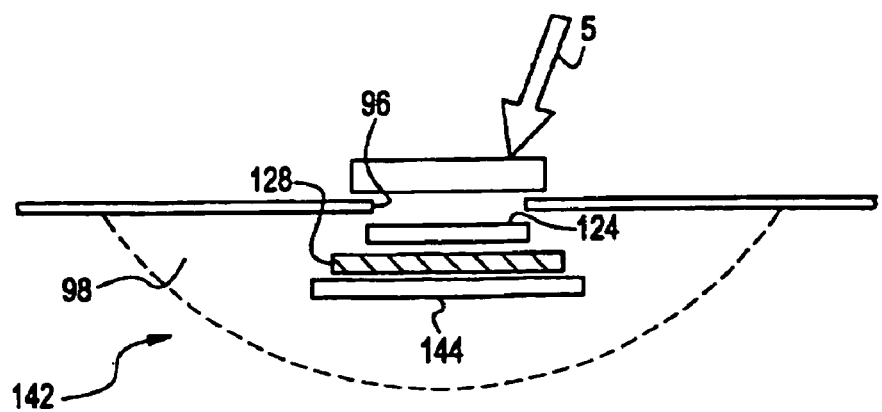
FIG. 14 is a partial cross sectional view of another embodiment of the invention showing an enclosed energy receptor.

FIG. 14 is an embodiment of an enclosed receptor/converter 142 somewhat similar to that of FIG. 13. The enclosed receptor/converter 142 includes an energy receiver plate 124 which functions to absorb energy from a power beam 5 entering the inlet 96 and convert the absorbed energy to heat. The energy receiver plate 124 is in heat transfer relationship with a direct energy conversion device 144. As previously discussed, the direct energy conversion device 144 is typically a thermoelectric generator, thermionic power generator or similar device for converting thermal energy directly to electrical energy. Heat transferred from the energy receiver plate 124 to the direct energy conversion device 144 is utilized to generate electricity for use in the PRS 44. Preferably, a thermal conduction dispersion plate 128 is disposed in heat transfer relationship between the energy receiver plate 124 and the direct energy conversion device 144. It should be noted that the conversion efficiency of thermoelectric generators at the present time is so low that this is not currently considered the best conversion device.

Preferably, in any embodiment the window covering the inlet 96 would be transparent to the incoming power beam 5, but would not allow energy internal to the converter to escape. Well known coatings applied over the window surface ensure any internally reflected energy would be reflected back into the converter and reabsorbed.

Obviously, there are many other combinations of devices that can be used for an energy receptor. The many and varied examples of energy receptors described herein are intended to be exemplary and are in no way intended to limit the scope of the invention unless otherwise specifically indicated.

Figure 8:
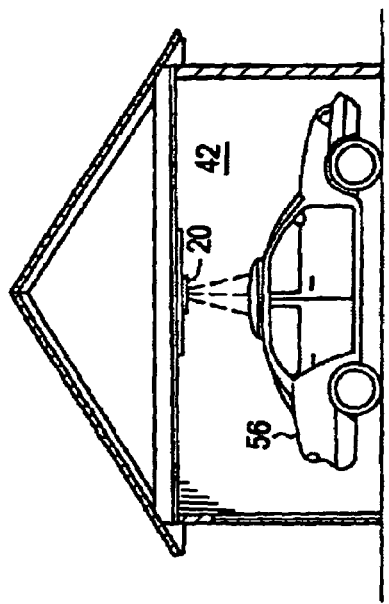
FIG. 8 is a perspective illustration of a power transmission unit incorporating a point of purchase device.
Figure 9:
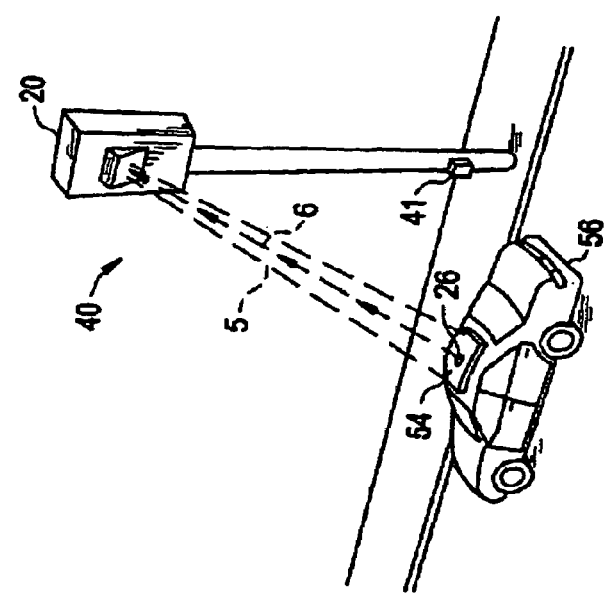
FIG. 9 is a side view of an embodiment of a power transmission unit installed in a garage.

FIGS. 8 and 9 show two possible methods for charging the energy storage unit 13 in a vehicle when the vehicle is not in use. FIG. 8 illustrates a point of purchase power transmission unit 40, including a control 41. The operator of vehicle would exchange currency in the form of cash or electronic transfer with the control 41 corresponding to a preselected amount of electrical energy. While parked in proximity to the point of purchase power transmission unit 40, the vehicle receptor 54 receives a power beam 5 from the power transmission unit 40. In a similar fashion, FIG. 9 shows a vehicle in a garage. A PTU 20 is installed above the vehicle. Charging of the vehicle occurs while the vehicle is parked in proximity with the PTU 20. It is contemplated that there also may be a PTU 20 mounted outside the garage to charge a vehicle parked in the driveway.

FIG. 10 shows a garage where two vehicles may be charged by a single PTU 20 located in the garage 42. Reflecting mirrors 3 are mounted above each vehicle's energy receptor 54 to direct the power beam 5 from the power transmitter 22 to each receptor 54 with or without need for a vehicle communication 6 signal. In addition, power transmission units operated as described above do not require the sophisticated tracking and locating capability of those described earlier. It is contemplated that the vehicles would be charged either sequentially or simultaneously.

Although reference is given specifically to microwave and laser wireless energy beams, these do not preclude the use of any other type of wireless energy beam that may be developed. The feasibility of electron beams, ion beams and other technologies are also contemplated in a remote power system. This in no way contradicts the basic definition of wireless (conductorless) power transmission as a point-to-point energy transfer in free space as previously discussed.

Currently, the distance that an all-electric vehicle can travel between charges with, for example, a battery pack as the energy storage unit, is 80–100 miles. This is the range the vehicle could travel if it did not encounter a power transmission unit to recharge the vehicle energy storage unit. But as the system grows and there are more power transmission units along the road to maintain the vehicle charge, the available range in the storage unit becomes less of an issue. The energy that is stored onboard the vehicle provides adequate reserve to move about freely between power transmission units. The power transmission units are constantly topping off the reserve-stored energy in the vehicle so that the vehicle can maintain this free movement.

Until power transmission units expand into rural areas, a hybrid vehicle as described herein above would ease the transition between a typical internal combustion engine vehicle and all-electric vehicle. For instance, electric vehicles would have small gasoline-driven generators that would start automatically to recharge the energy storage unit if a power transmission unit were not encountered for some distance. If enough power transmission units are present to charge the energy storage unit, then the gasoline-driven generator is never started or used.

An example of the operation of an embodiment of the present invention is that of a bus. For illustration purposes it is contemplated the bus is an all-electric bus that has the mobility of a current bus incorporating an internal combustion engine as the mode of power. Consider a 46-passenger bus, having a mass of 15,000 kg and a 195 kW (277-hp) electric motor. For city traveling, consider power transmission units to be spaced every 1 kilometer (km). In certain embodiments, for example, a busy downtown street, it is contemplated that there may actually be a power transmission unit placed every 200 to 300 meters (m), but for this example 1 km will be used. It is assumed that the bus travels at 55 km/h (35 mph) and a power transmission unit has a line of sight visibility of the bus 150 m prior to the power transmission unit and 150 m after the power transmission unit. That is, the power transmission unit has visibility of the bus for 300 m and can charge the onboard energy storage unit for 19.64 seconds at a bus speed of 55 km/h.

The amount of energy that can be transferred at the present time via wireless power transmission is approximately 450 kW. The efficiency of such energy transmissions has been estimated to be about 76%. Therefore, for this example, a conservative value of 150 kW will be received and stored in the energy storage unit of the bus. At 55 km/h, the energy storage unit will receive 0.8182 kW-h of energy as it passes the power transmission unit. Although the bus motor has a full power capability of 195 kW, when the vehicle is traveling at 55 km/h, the motor utilizes about 35 kW. With power transmission units every 1 km, the bus will consume 0.6364 kW-h of energy. That is 22.2% less than can be theoretically supplied by the power transmission unit. Therefore, the bus does not have to receive a power beam from the power transmission unit the entire time between units if the electrical storage unit on the bus is substantially fully charged.

Now consider the same bus making a stop for passengers. To accelerate the vehicle from a stop to 55 km/h, consider the bus to use 175 kW. The bus will have to pause about 25 seconds to allow passengers to enter and exit the bus, and all the time the bus is standing still, the power transmission unit can be charging the electrical energy storage unit. Allow the bus 10 seconds to accelerate up to speed. From the time the bus comes into view of the power transmission unit, stops for passenger movement, and then leaves the bus stop, 1.4583 kW-h of energy is added to the bus's energy storage unit. To accelerate the bus up to 55 km/h, and travel to the next power transmission unit, the bus consumes 0.9316 kW-h of energy. Again, the energy used by the bus is considerably less than was added to the system by the remote power system. Therefore, the bus energy storage unit would not have to receive the power beam the entire time of the stop if it was close to a full charge.

In another example, a private vehicle or private passenger car will be considered. For the suburban setting, it can be assumed that power transmission units are located every 2 km. The private vehicle will be about 750 kg with a 28 kW (40-hp) electric motor. Traveling at 55 km/h (35 mph) the vehicle will require about 4.9 kW of power. Again, with the power transmission unit's line of sight of the vehicle being 300 m, the energy storage unit will receive 0.8182 kW-h of energy. The vehicle will consume 0.1779 kW-h of energy traveling at 55 km/h with 2 km between the power transmission units. This is 78.3% less energy used than is theoretically available to the vehicle from the power transmission unit.

Now consider the above private vehicle traveling at 105 km/h (65 mph) on the highway. The vehicle will require about 17.5 kW of power to travel at this speed. When passing a power transmission unit, the vehicle will receive 0.4286 kW-h of energy which is added to the energy storage unit. With the power transmission units spaced 2 km apart, the vehicle will consume 0.3328 kW-h of energy between possible charging of the energy storage unit onboard the vehicle. This is 22.4% less than can be theoretically received by the vehicle via the wireless power transmission system.

Energy transmission between a PTU 20, 60 and PRS 44 may take the form of bursts or pulses or small packets of energy. In this way, each short burst of energy can be acknowledged by the translocator to ensure a safe transfer of energy. Without proper acknowledgment for each energy burst, no more energy will be transferred until the PRS 44 and power transmission unit has reestablished a communication link. The bursts can be sized so that if a person were struck by one, two or several of these unacknowledged energy packets or bundles, there would be no effect on the person. It should be realized that the transmission of pulses of energy as a wireless power beam to a receptor and verification of the transmission or receipt of the pulses has application in other areas. As an example, such transmission may be used in laser machining or surgical applications where the energy receptor is a target, such as, for instance, a workpiece.

Consider, for example, a 450 kW power beam used to recharge a traveling vehicle. The distance of communication and energy transmission may be 150 m on either side of the power transmission unit or 300 m total. Guidance and energy beam travel time is a maximum of 500 nanoseconds (ns) between transmitter and receiver for this distance. For a vehicle traveling at 105 km/h, the vehicle will travel microns in 500 ns.

Allow one burst of energy to last 1,000 ns, then the power transmission beam is shut down, waiting for verification from the vehicle receiver. The response time for verification of reception of the energy will be a maximum of about 500 ns. Then another burst of energy is transmitted, etc. As the vehicle moves closer to the power transmission unit, the response time for verification of receipt of the energy beam will lessen; therefore, more energy will be transmitted. And as the vehicle moves away, less energy will be transmitted.

One burst of energy at the 450 kW level for 1,000 ns is 0.450 w-s. This is equivalent to being exposed to $\frac{1}{220}$ the energy of a 100 watt light bulb for 1 second. Without verification of receipt from the vehicle, this is the maximum energy that a human being or inanimate object would be exposed to. Additionally, the remote power system has no lag time or inertia, when the power beam is turned off there is no residual energy in transit. Further, the power transmitter may be instantly deactivated. Thus, the remote power system 1 presents an inherently safe energy transmission system. The use of a coded and/or encrypted vehicle communication signal further enhances the safety of the remote power system 1 by preventing stray signals or interference from actuating the power transmission unit, thereby making false activation, either intentional or unintentional, of the power transmitter difficult.

Other safety devices may be added to different embodiments of the remote power system 1. The PTU 20 may comprise a motion or position sensitive switch. When the PTU 20 is jarred or moved out of position, the switch will deactivate the power transmitter 22, ending power beam 5 transmission. Thus, a power transmitter 22 in a hurricane or earthquake or on a utility pole 21 struck by a vehicle would be shut down before the power beam 5 could cause damage or injury. It should be noted that the power transmitter 22 would also be shut down in the above circumstances if the vehicle communication signal 6 was lost by the PTU 20.

Figure 15:
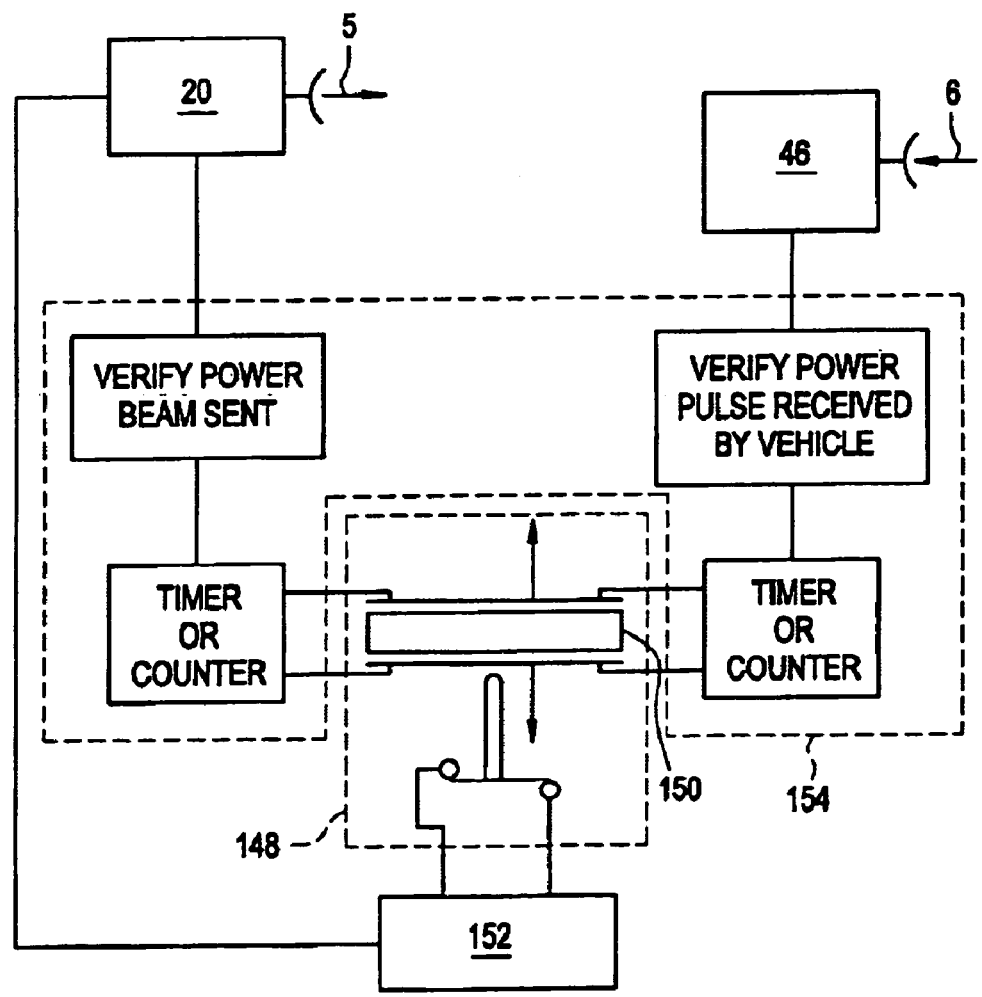
FIG. 15 is a schematic view of an aspect of the invention showing a two-way fuse.

With reference to FIG. 15, in some embodiments the PTU 20 may comprise a two-way fuse 148. The two-way fuse 148 is activated by the energy transmitted from the power transmitter 22 and deactivated by the acknowledgment of energy received by the PRS 44 via communication signal 6. When the energy transmitted is not acknowledged as received, the two way fuse 148 activates a shutoff device 152, shutting down the power transmitter 22. The shutoff device 152 can be a mechanical switch, a disposable electrical connection or other well-known device. The power transmitter shut down may be for a period of time, after which time the fuse 148 automatically reactivates and allows the power transmitter 22 to begin transmission of a power beam 5 to a verified receptor 54. Multiple two-way fuse deactivations within a set time period would permanently deactivate the fuse 148 and power transmitter 22, requiring manual replacement or resetting of the fuse 148.

In an embodiment of the invention wherein the power beam is continuous, the two way fuse will be activated by the amount of energy transmitted and deactivated by the amount of energy received. When the amount of energy transmitted is greater by a predetermined amount than the amount of energy acknowledged as received, the two way fuse activates a shutoff device 152, shutting down the power transmitter 22.

Alternatively, the two-way fuse 148 may be permanently deactivated initially; requiring manual replacement or resetting before the power transmitter 22 can again be activated. Preferably, the two-way fuse 148 automatically reactivates after deactivation when the PTU 20 establishes a new communication link with the PRS 44.

The two-way fuse can comprise multiple configurations. In one embodiment shown in FIG. 15, the two-way fuse 148 comprises a piezoelectric element 150. After a communication link has been established between, for example, the PRS 44 and the PTU 20, the power transmitter 22 sends a first power beam 5 pulse to the energy receptor 54, deflecting the piezoelectric element 150 one increment toward activating the shutoff device 152. The vehicle 56 receives the power beam pulse at the energy receptor 54, converts the power beam pulse to a usable energy form at the converter 11 and stores the energy in the storage unit 13. The PRS 44 acknowledges receipt of the power beam pulse and requests a second power beam pulse from the PTU 20 via the translocator signal 6. The translocator signal 6 is normally a constant beacon. Acknowledgment by the PRS 44 of a burst of energy from the PTU 20 is superimposed with the translocator signal to activate the two-way fuse 148. As long as more energy is needed, transmission of the translocator signal 6 and therefore the energy beam 5 will continue.

The acknowledgement of the first power beam pulse is received by the power unit communication device 46 and functions to deflect the piezoelectric element 150 back one increment away from activating the shut off device 152. The request for a second power beam pulse is processed by the power unit controller 48, and a second pulse is sent to the energy receptor 54, again deflecting the piezoelectric element 150 one increment toward activating the shutoff device 152. In sum, for each power beam pulse that is transmitted from the power transmitter 22, the piezoelectric element 150 deflects one increment toward activating the shutoff device 152 and terminating power beam transmission. For each acknowledgment 6 from the same PRS 44, the piezoelectric element 150 deflects one increment away from activating the shutoff device 152. The deflection of the piezoelectric element 150 can be designed to activate the shutoff device 152 and terminate power transmission before a dangerous number of power beam pulses are transmitted.

Figure 16:
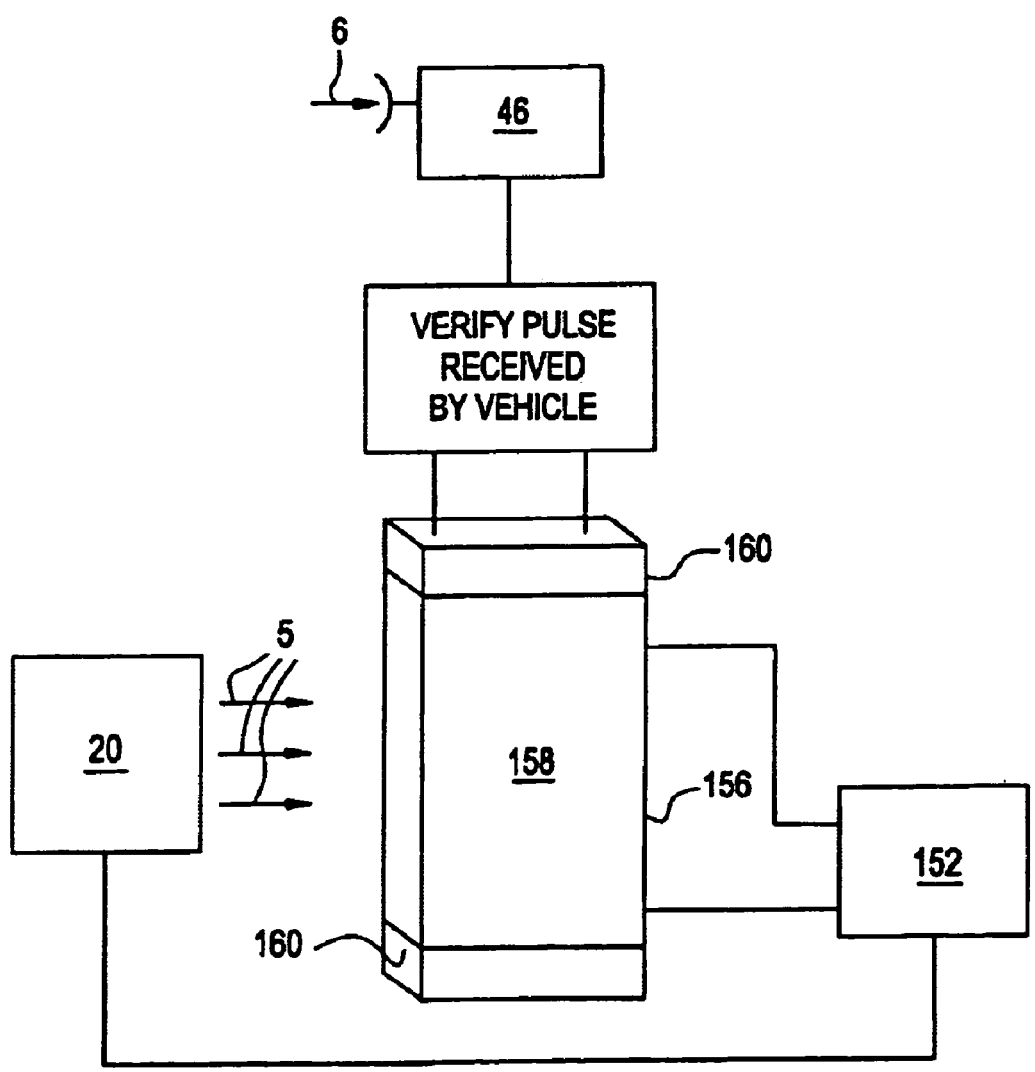
FIG. 16 is a schematic view of an aspect of the invention showing a pathway sensor safety device.

Another safety device that can be incorporated into the PTU 20 is a pathway sensor 156 which is schematically shown in FIG. 16. The pathway sensor is mounted within the path of the power beam 5, for example, in a channel or conduit of the power transmitter 22. The pathway sensor 156 functions to shut down the PTU 20 prior to any abnormally high levels of energy leaving the power transmitter 22. Thus, the pathway sensor provides for an inherently safe remote power system.

The pathway sensor 156 comprises a sensor element 158. A portion of the power beam 5 strikes the sensor element 158 and a small portion of the power beam is absorbed, causing heating of the sensor element 158. Typically, only a very small percentage (less than 0.1%) of the power beam is absorbed by the pathway sensor. The heat absorbed by the sensor element 158 is removed by an external cooling source 160, such as, for example, a thermoelectric cooling device. The cooling source 160 is activated by the translocator signal 6 through the power unit controller or separate safety monitor (not shown). As long as the power unit communication device 46 receives the translocator signal 6, the cooling source 160 will remain activated and heat imposed by the power beam pulses will be removed from the sensor element 158. Since the sensor element 158 is continuously cooled, this embodiment is properly named a continuously cooled pathway sensor. If a predetermined number of power beam pulses strike the sensor element 158 without cooling, the sensor element overheats and "burns out", (i.e., breaks) actuating a shutdown device 152 to terminate transmission of a power beam 5 from the power transmitter 22. The continuously cooled pathway sensor 156 would have to be replaced before the power transmitter 22 could resume transmission of a power beam 5.

The shape of the sensor element 158 presented to the power beam 5 will establish the amount of energy, and thereby heat, absorbed from each power beam pulse. Materials such as, for example, aluminum, copper, steel, stainless steel and alloys thereof are suitable for manufacture of the sensor element 158. The heat in the sensor element 158 must be dissipated quickly by the cooling source 160 for the power transmitter 22 to operate most efficiently. Therefore, the design and selection of the sensor element 158 profile will depend on the radiative and conductive properties of the sensor element 158 material chosen, surface finish, ambient temperature within the power transmitter conduit, radiation view factors, type and magnitude of the power beam, etc. While almost any sensor element 158 profile is possible, it is believed that sensor elements having trapezoidal, triangular, circular, ellipsoidal and diamond cross-sectional shapes are advantageous. The sensor element 158 may also comprise a thin wire or wires, a grid of wires, a thin wire with a tab or wafer or multiple tabs or wafers in the power beam pathway. The use of a tab or wafer in cooperation with a wire sensor will increase the amount of energy absorbed from each power beam pulse, assuring sensor element burnout and deactivation of the power transmitter if cooling from the cooling source 160 is not maintained.

Figure 17:
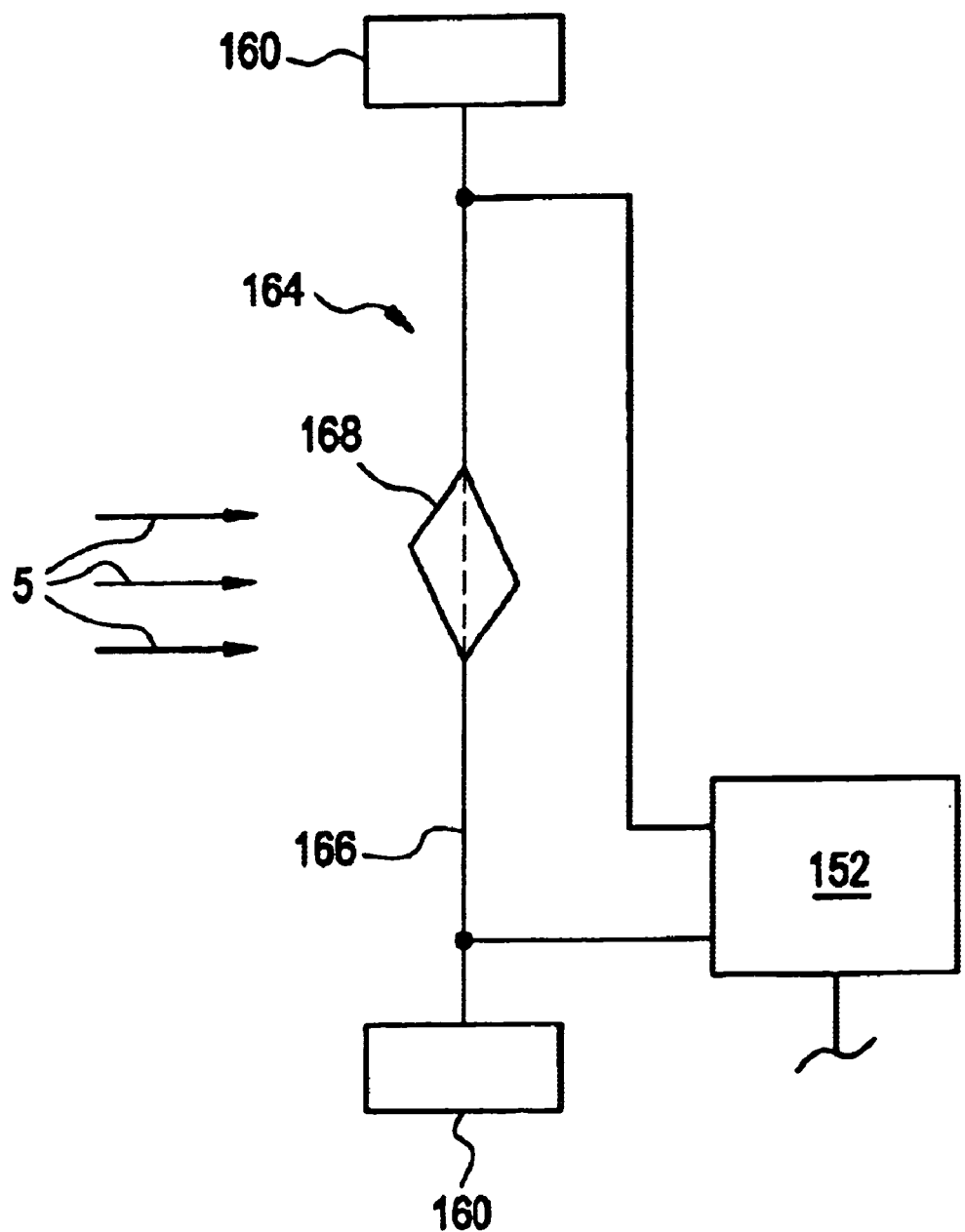
FIG. 17 is a schematic view of another embodiment of a pathway sensor safety device.

FIG. 17 illustrates a different embodiment of a pathway sensor 164 wherein the sensor element is intermittently or "pulse" cooled. The sensor element is a thin wire 166, and may include a tab or wafer 168 to increase energy absorbed from each power beam pulse. In this embodiment, for each power beam pulse acknowledgment received by the power unit communication device 46, the cooling source 160 is turned on momentarily to dissipate the portion of the energy absorbed by the acknowledgement of power beam receipt. Without acknowledgment of the power beam pulse, the cooling source 160 is not activated and the sensor element 166 burns out, actuating the shut off device 152 and terminating power beam 5 transmission. Reactivation of the power transmitter 22 requires manual replacement of the burned out sensor element 166.

Figure 18:
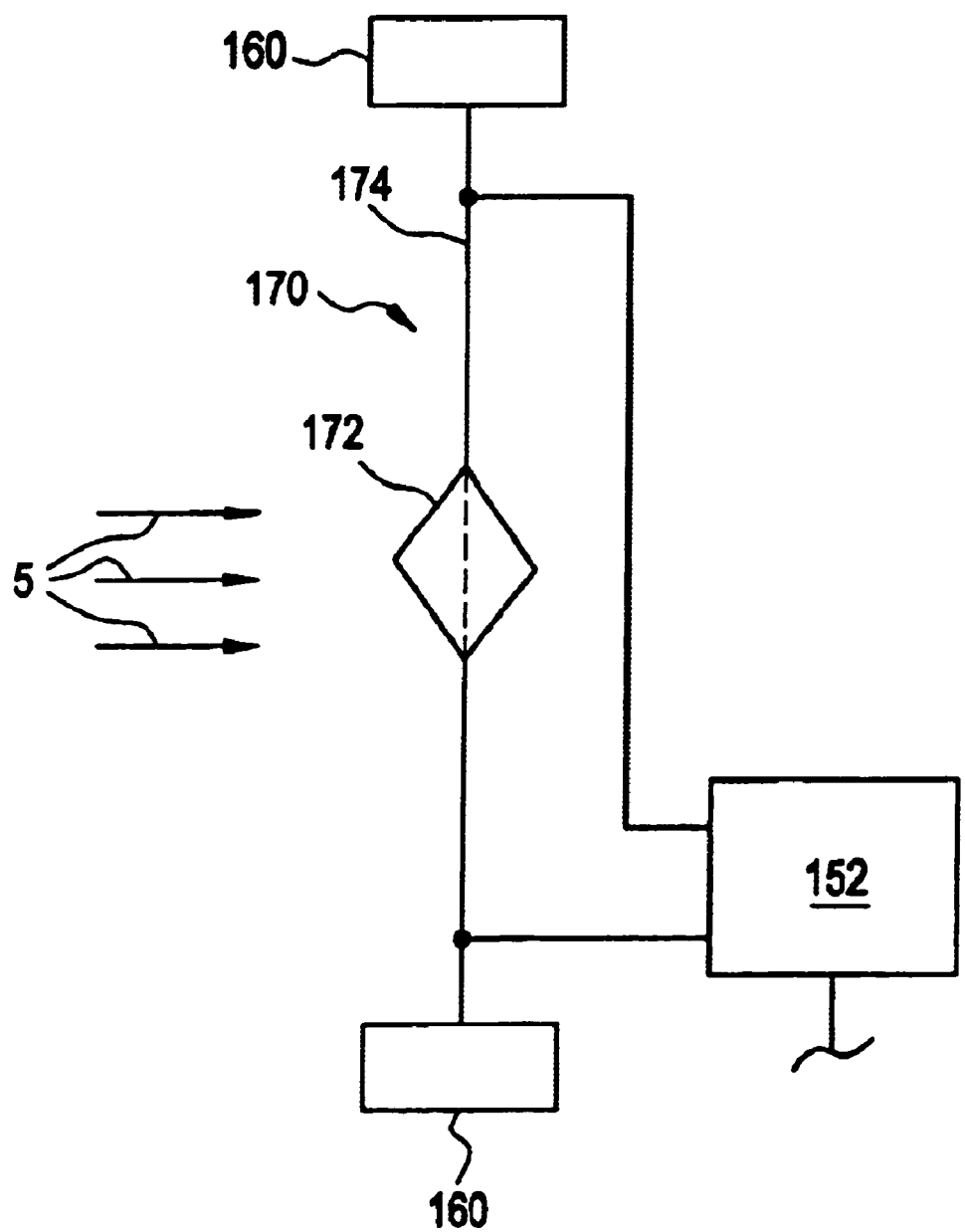
FIG. 18 is a schematic view of another embodiment of a pathway sensor safety device.

FIG. 18 illustrates another embodiment of a pathway sensor 170 wherein the sensor element is a piezoelectric element. Preferably the sensor element comprises a piezoelectric tab or wafer 172 mounted to a support wire 174. The piezoelectric element 172 is sized and finished so that a power beam pulse striking the element 172 distorts the element a predetermined amount. The acknowledgment signal from the vehicle 56 returns the piezoelectric element 172 to its original condition. Therefore, the sensor element 172 normally transitions between the normal and deflected condition. If too many power pulses strike the piezoelectric element 172 without a corresponding acknowledgment signal, the sensor element 172 distorts to the point where the support wire 174 "fails", actuating the shut off device 152 and terminating power beam 5 transmission. Reactivation of the power transmitter 22 requires manual replacement of the burned out sensor element 172.

For certain applications, pathway sensor response may become an issue. That is, poor sensor response to high heat transfer transients; heating, cooling, etc. will be a function of the mass of the sensor, the diameter of the wire, and/or the surface area of the tab or wafer, the thickness of the wafer, etc. Therefore, an alternative pathway sensor configuration (not shown) would have a pathway sensor including simultaneous balanced heating and cooling of the wire, grid or wafer tab elements stimulated continuously by the outgoing power beam and the incoming vehicle communication signal, respectively. If one of these stimulants fails causing interruption of the balanced heating and cooling, the element fails and the power beam will be shut down. If sensor element cooling were lost due to a system failure or loss of the vehicle communication signal, the sensor element would overheat and burn out, shutting down the power transmitter and power beam immediately. If the power transmitter fails, the power beam is terminated.

Figure 19:
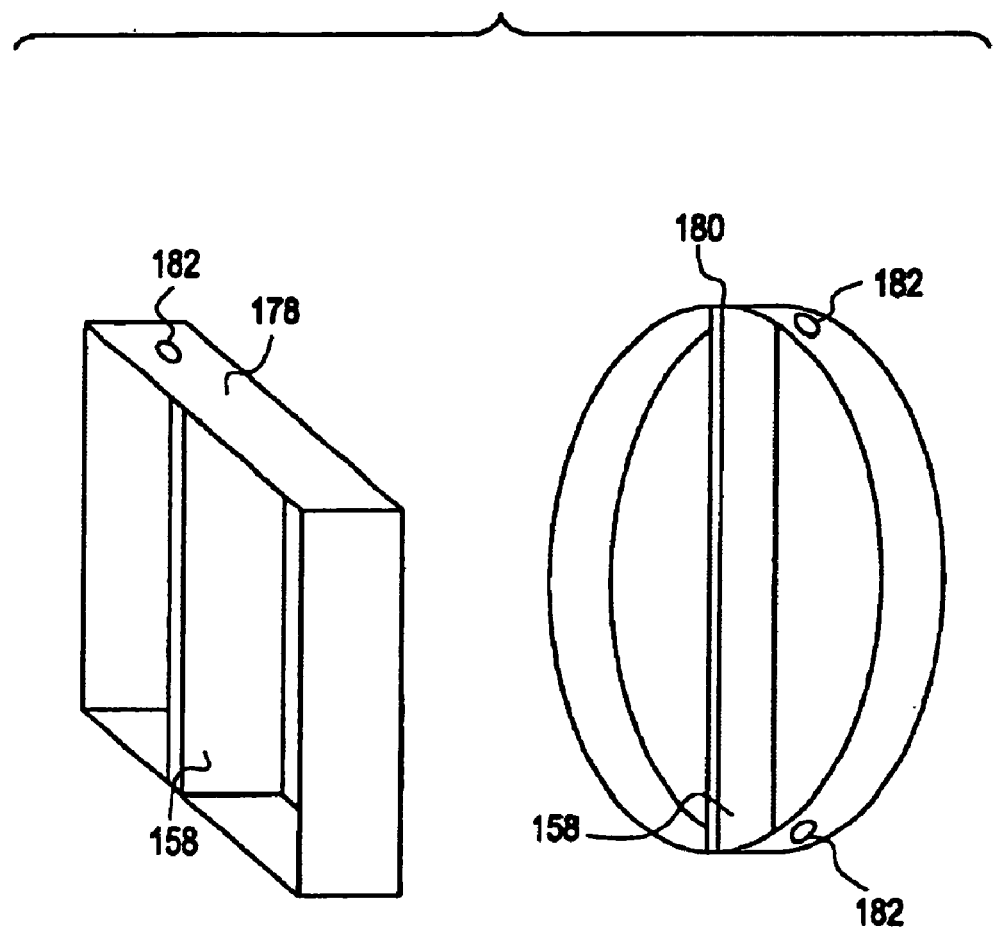
FIG. 19 is a perspective view of a pathway sensor element mounted in different embodiments of a support frame.

Since some embodiments of a pathway sensor require replacement after burn out, the sensor element is desirably readily replaced. FIG. 19 illustrates, for example, square 178 and circular 180 pathway sensor frames within which a sensor element is mounted. Other pathway shapes and corresponding pathway sensor frame shapes are contemplated by the invention. Naturally, any type of sensor element could similarly be mounted in the frames 178, 180. The frames fit within a correspondingly shaped power transmitter conduit. Electrical contacts 182 on the pathway sensor frames 178, 180 physically contact corresponding contacts on the shutdown device 152. The frames 178, 180 and thereby the burned out sensor element are quickly and easily replaced.

The PRS 44 can comprise a security zone enveloping the region around and/or above the energy receptor 54 for additional safety. In this way, if someone inadvertently places a hand in the security zone around the energy receptor 54, the power transmitter unit is signaled to stop transmitting the power beam 5. In one embodiment shown in FIG. 22 a plurality of motion sensors 192 survey or monitor the area above the vehicle energy receptor 54. The interlocking of the security zone 190 with the translocator signal 6 on the vehicle will shut down the wireless power beam 5 if there is a breach of the security zone in the region of the energy receptor 54. Any object that crosses into the security zone 190 triggers the motion sensors 192 and interrupts the translocator signal 6, stopping the wireless power beam 5.

This technology is well known for detection systems in homes, around automated machinery in manufacturing facilities, security systems in museums, prisons, banks, etc. This will render the area above the energy receptor safe for any people in close proximity or those that may accidentally (or purposely) touch the energy receptor area. The security zone 190 may also move with the energy receptor 54 if required for added security.

Figure 23:
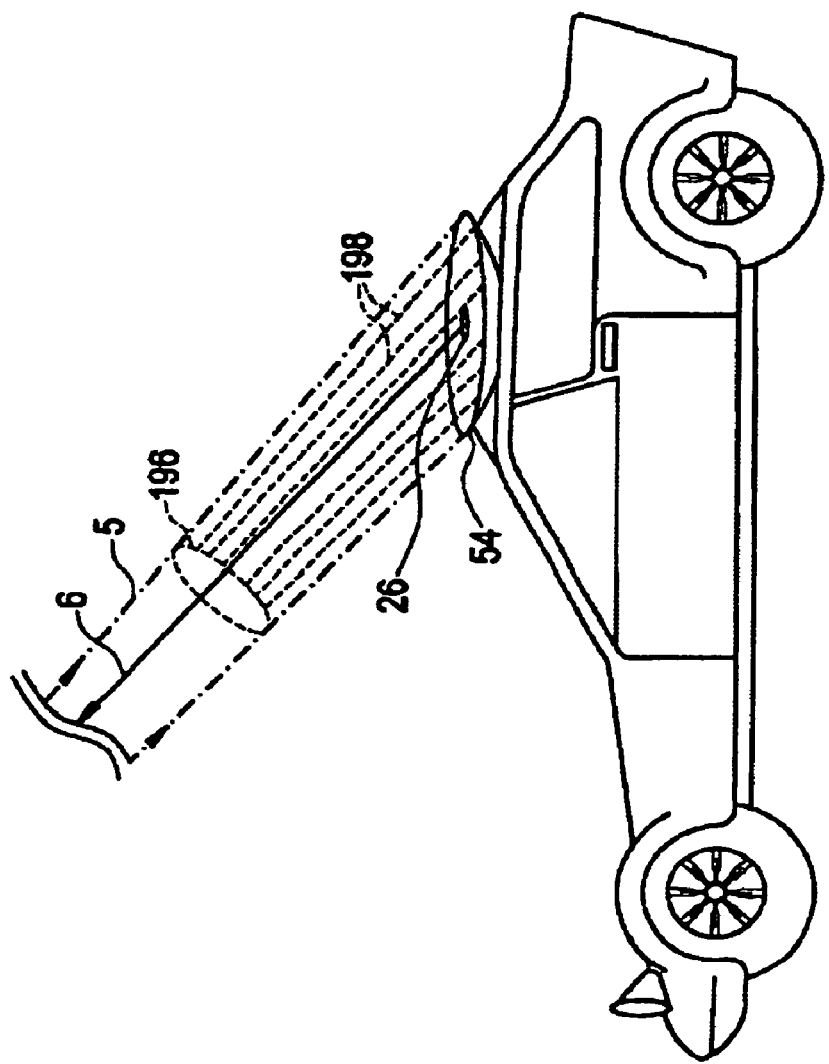
FIG. 23 is another embodiment of the invention incorporating a security zone.

FIG. 23 shows another embodiment where the translocator signal creates a security zone 196 above the energy receptor 54. Here a first translocator signal 6 emanates from the translocator antenna 26 and additional translocator signals 198 emanate from around the periphery of the energy receptor. Continuous or intermittent translocator signals 198 can be transmitted in rotation, simultaneously or however (sequential, continuous, intermittent, etc.) from various locations on the energy receptor. Any object that crosses into the security zone 196 interrupts the additional translocator signals 198 and thereby signals the power transmission unit to shut down transmission of the power beam. The security zones 190, 196 ensure safe power transmission while recharging is taking place.

Figure 25:
FIGS. 25–27 illustrate a cell phone incorporating a power receiving system according to aspects of the present invention.
Figure 26:
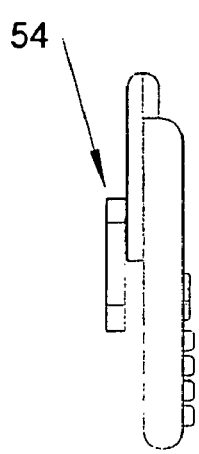
Figure 27:
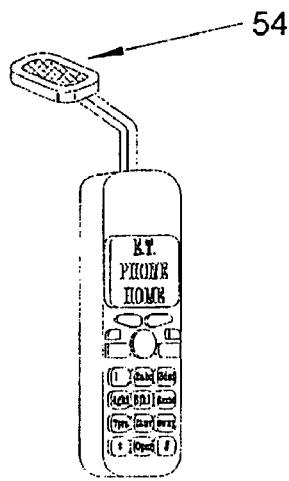
Figure 28:
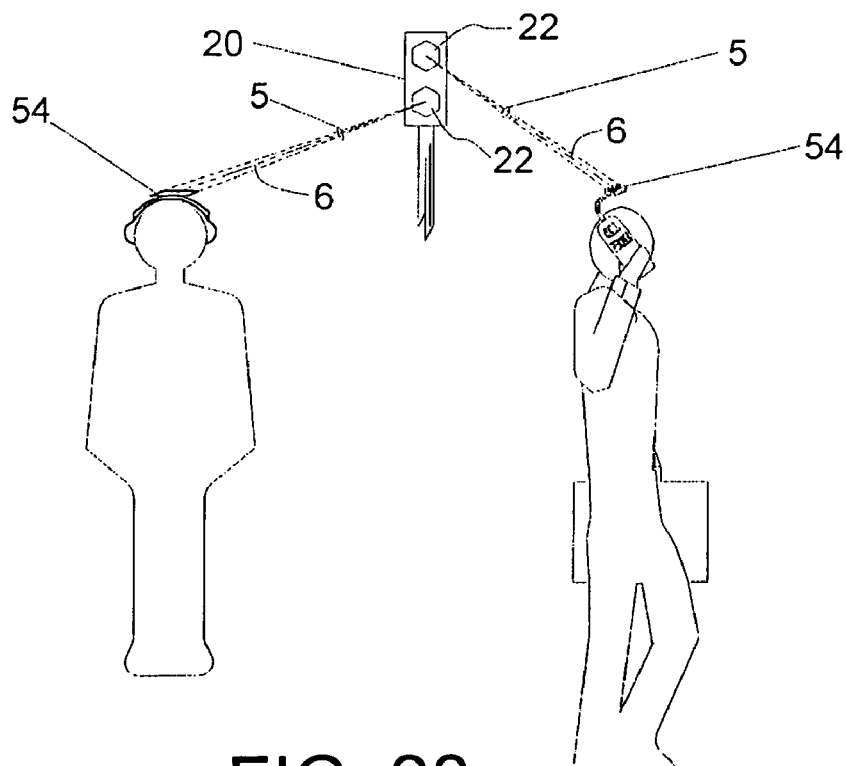
FIG. 28 illustrates a remote power system powering a cell phone and a personal stereo according to aspects of the present invention.

FIGS. 25–27 illustrate a cell phone equipped with a PRS 44 including an energy receptor 54. The illustrated energy receptor 54 is configured to fold behind the cell phone when not in use. In the context of the present invention, the cell phone represents a low power electronic device. For such low power electronic devices, the density of the required wireless power beam is approximately 20 watts/m². It is contemplated that the communication signal to the cell phone could be utilized to power the cell phone and trickle charge the phone battery within the context of the present invention. Such a weak power beam need not necessarily take the form of a directional power beam and could be generally transmitted under current regulations. The power beam would be used to both power the cell phone and provide the incoming portion of a two-way communications linkage to the phone network.

Figure 29:
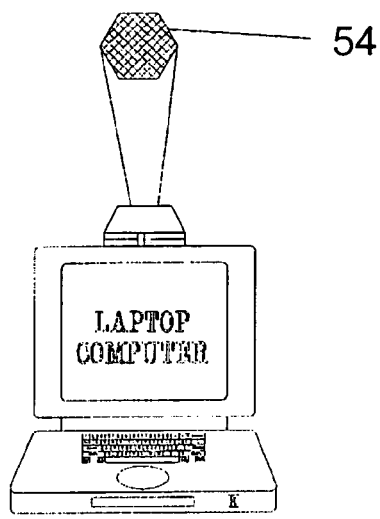
FIGS. 29 and 30 illustrate a lap top computer equipped with alternative embodiments of a power receptor according to aspects of the present invention.
Figure 30:
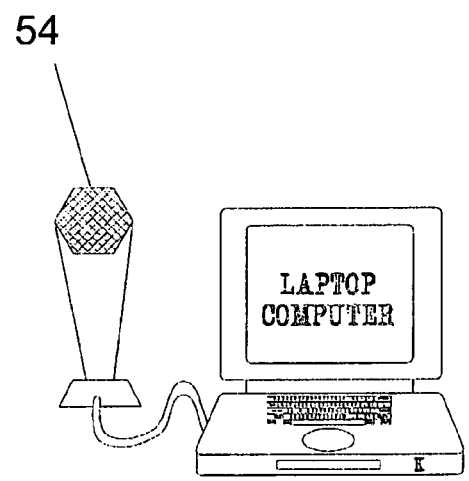

FIGS. 29 and 30 illustrate a laptop computer equipped with a PRS 44 including an energy receptor 54. In FIG. 29, the PRS 44 and energy receptor 54 are incorporated into the laptop itself. FIG. 30 illustrates a PRS 44 energy receptor 54 accessory connected to the laptop by a cord. In this manner existing laptops could be powered by a remote power system 1 according to aspects of the present invention.

Figure 31:
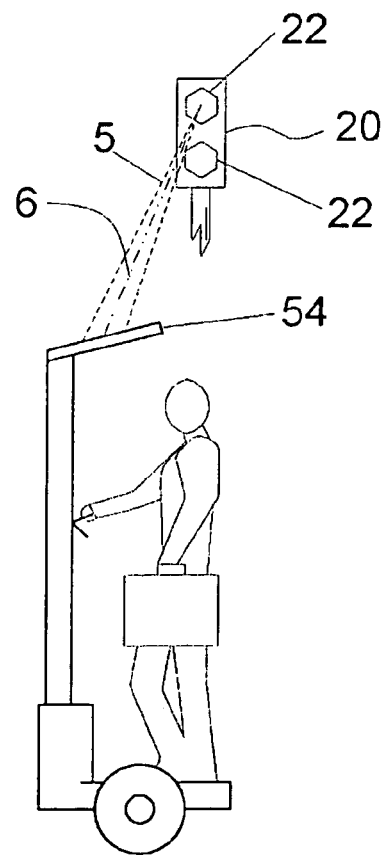
FIGS. 31 and 31A illustrate a remote power system powering a personal transportation vehicle and electric wheelchair, respectively, according to aspects of the present invention.
Figure 31A:
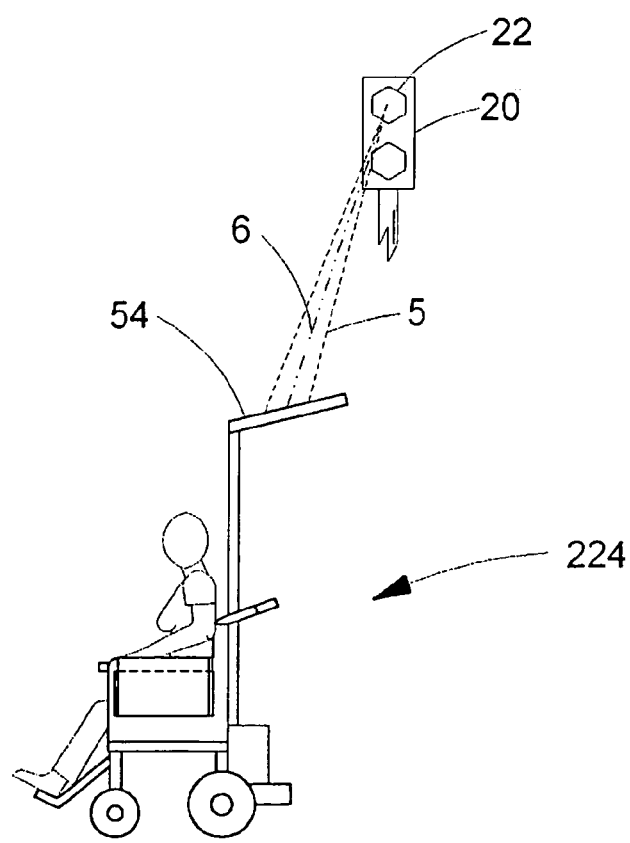

FIG. 31 shows a convenient means to maintain the charge for the power plant of a personal people mover. This could be the typical "stand-up" type now available as shown, or could include wheelchairs 224 for people with disabilities as illustrated in FIG. 31A.

Figure 32:
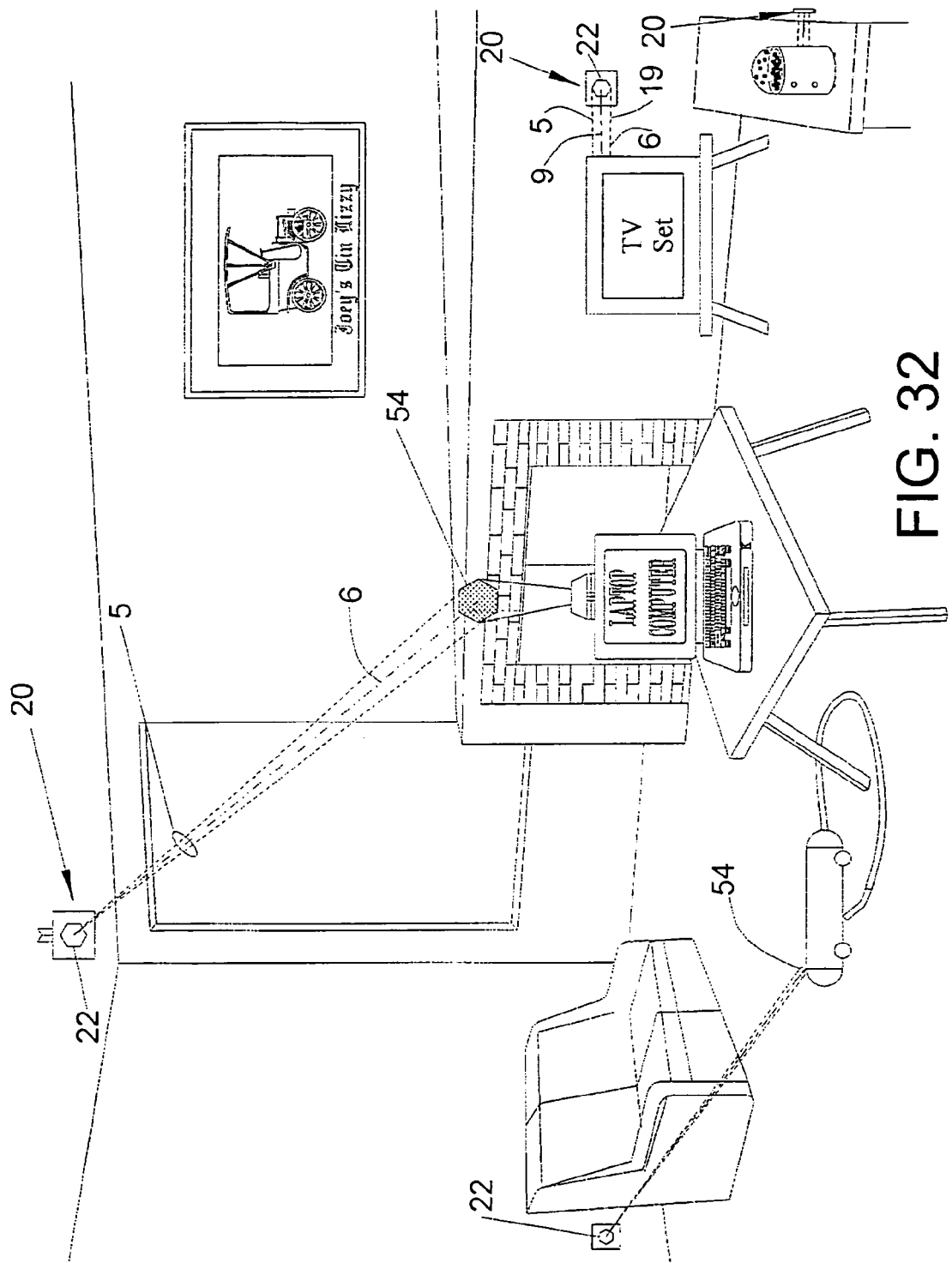
FIG. 32 illustrates a remote power system incorporated into a home setting according to aspects of the present invention.

FIG. 32 illustrates a remote power system incorporated into the home environment. Power transmitters 22 are installed in the walls and ceiling. The appliances shown are equipped with a PRS 44 including an energy receptor 54. When the appliances need more power, they send a PRS communication signal which results in a wireless power beam 5 from the nearest available power transmitter as previously discussed. In the context of the television, the PRS communication signal 9 and PTU communication signal 19 could enable an interactive wireless connection to a cable-type media delivery service. Other appliances, including a vacuum cleaner, popcorn maker and laptop are shown linked to a remote power system in accordance with aspects of the present invention. Unsightly and, in the case of the vacuum cleaner, cumbersome power cords are eliminated. The various safety devices and features discussed above may be applied to the home based remote power system to prevent harm to children and pets.

Figure 33:
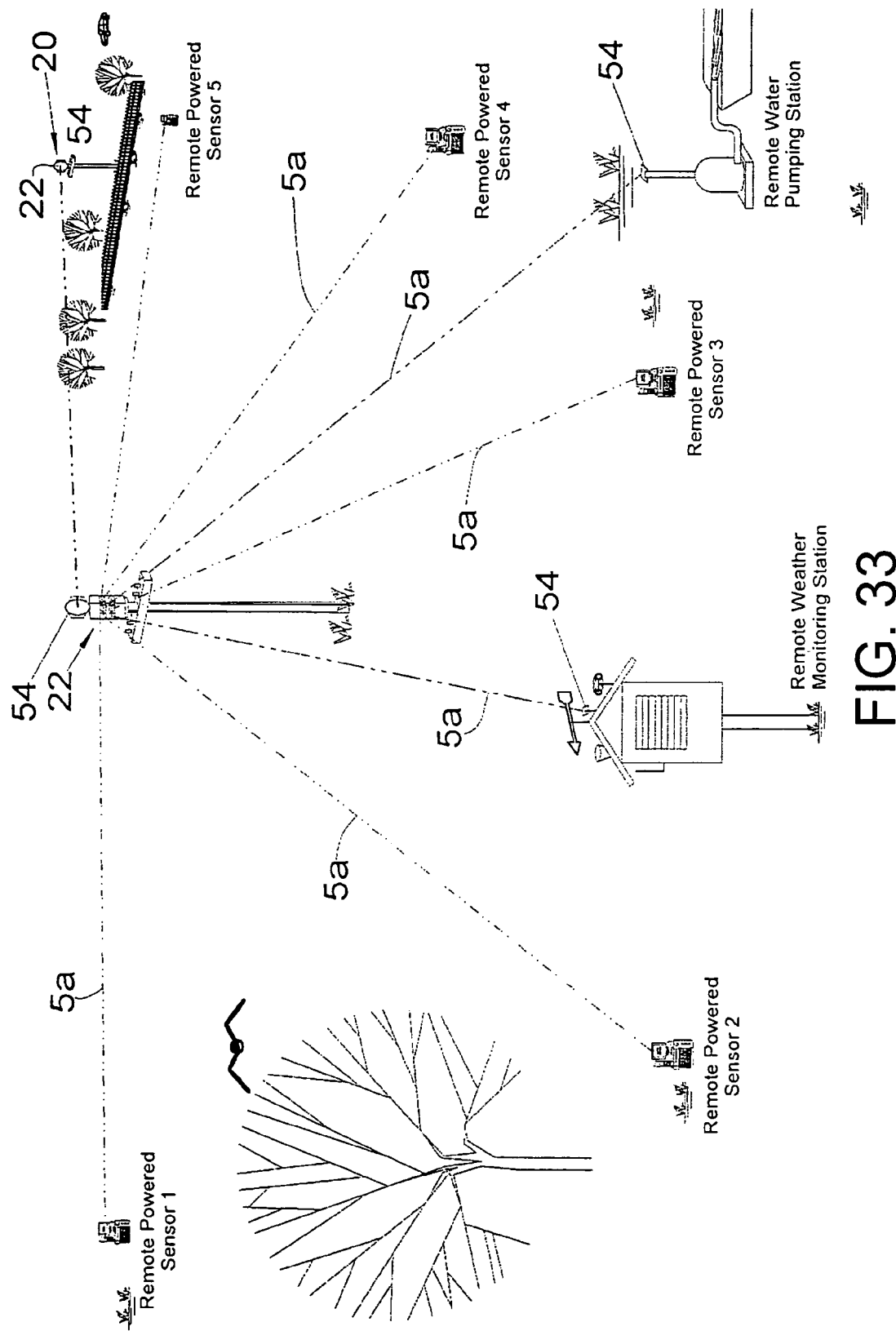
FIG. 33 illustrates a remote power system incorporated into an outdoor setting according to aspects of the present invention.

FIG. 33 illustrates a remote power system configured for a location without a connection to the power grid. The illustrated PTU 20 gets its power from another PTU (not shown) by wireless (conductorless) power beam. The PTU 20 then distributes that power to several electronic and electrically powered appliances by wireless power beam as previously discussed. Among the appliances are a network of sensors for detecting entry through a security perimeter. A water pumping station and weather monitoring station are also examples of appliances in need of remote power. The wireless power system recharges on board power storage on demand as previously discussed in the context of other embodiments.

A yet further possible use for the remote power system is to include a PRS 44 in the black box (locating beacon) for ships and aircraft. Currently, the black box must be found before its on-board power source is depleted, or the homing beacon stops. Equipping the black box with a PRS 44 would allow search with a wireless power beam after the on-board power is depleted. When exposed to the wireless power beam, the PRS 44 would provide energy to operate the beacon and possibly charge the depleted on-board power of the box.

Indeed, lost military aircraft (jets, missiles, etc.) can be searched for years later as long as the "black box" remains intact. In fact, with small electronic packaging, the military can have a wireless (conductorless) power beam translocator (transponder) package on every hand-held missile launcher (and/or missile) that is ever built, and find them almost immediately with hand-held PTUs or satellite-mounted PTUs. Translocators built into and interconnected with firing/guidance electronics would preclude usage in the wrong hands without immediate detection.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A wireless recharge system for electronic equipment comprising:
    an energy source;
    a power transmission unit operably connected to the energy source comprising:
        a power transmitter functioning to transmit energy as a wireless power beam when activated;
        a communication receiver configured to detect a power request signal and provide a request indication;
        a power unit controller operably connected to the communication receiver and the power transmitter, the power unit controller responsive to said request indication to activate said power transmitter; and
    a first power receiver system comprising:
        an energy receptor configured to receive the wireless power beam;
        an energy storage unit;
        an energy beam converter that transforms energy from the received wireless power beam to an energy form compatible with said energy storage unit;
        a power usage monitor operatively connected to said energy storage unit to detect a quantity of power stored in said energy storage unit; and
        a power receiver system transmitter that produces the power request signal as a function of the quantity of power stored in said energy storage unit as detected by said power usage monitor.

2. The wireless recharge system of claim 1, wherein the power receiver system transmitter is connected to the power usage monitor means to transmit said power request signal when the quantity of stored power falls below a predetermined level and terminates the said power request signal when the quantity of stored power is at or above the predetermined level.

3. The wireless recharge system of claim 1, wherein the power transmission unit comprises a signal tracking module to identify a location of origin of said power request signal and a power transmitter aiming module to direct said wireless power beam at said location of origin.

4. The wireless recharge system of claim 1, further comprising a second power receiver system having second energy receptor configured to receive the wireless power beam wherein the power transmission unit transmits the power beam to both the first and second energy receptors.

5. The wireless recharge system of claim 1, wherein the wireless power beam is in the form of a plurality of discrete energy pulses.

6. The wireless recharge system of claim 1, wherein the power transmitter transmits said wireless power beam as a first discrete energy pulse, the first power receiver system verifies receipt of the first energy pulse to the power transmission unit and the power unit transmitter transmits a second discrete energy pulse only after verification.

7. The wireless recharge system of claim 1, wherein the power transmission unit comprises a two way fuse for terminating transmission of the power beam after a predefined quantity of energy has been transmitted unless the first power receiver system verifies receipt of the predefined quantity of energy to the power transmission unit.

8. The wireless recharge system of claim 1, comprising a two way fuse for terminating transmission of said power beam after a predefined quantity of energy has been transmitted unless the first power receiver system verifies receipt of the predefined quantity of energy to the power transmission unit, wherein the two-way fuse means comprises a piezoelectric element.

9. The wireless recharge system of claim 1, comprising a pathway sensor at least partially located in a path of the power beam, for terminating transmission of the power beam after a predefined amount of energy has been transmitted unless the first power receiver system acknowledges receipt of the predefined amount of energy to the power transmission unit.

10. The wireless recharge system of claim 1, wherein said energy beam converter transforms said power beam to a thermal energy form.

11. The wireless recharge system of claim 1, wherein the energy beam converter transfers energy from the power beam to a supply of a working fluid.

12. The wireless recharge system of claim 1, wherein the energy receptor and the energy beam converter comprise a rectenna that converts at least part of said power beam into electricity.

13. The wireless recharge system of claim 1, wherein the energy receptor and the energy beam converter comprise an enclosed energy receptor for receiving the power beam and transforming energy in the received power beam to said energy form compatible with said energy storage unit.

14. The wireless recharge system of claim 1, wherein the energy receptor and the energy beam converter comprise a plurality of different energy receptors for receiving the power beam.

15. The wireless recharge system of claim 1, wherein said power request signal is a directional signal.

16. The wireless recharge system of claim 1, wherein said power request signal is a general broadcast signal.

17. The wireless recharge system of claim 1, wherein the power receiver system transmitter alternates between a directional power request signal in a single direction and a general broadcast power request signal in a plurality of directions.

18. The wireless recharge system of claim 1, wherein said power transmitter includes a communication unit to transmit a power unit communication signal and the first power receiver system includes a power receiver system receiver to receive said power unit communication signal, the power request signal and the power unit communication signal providing for a two way communication link between the power transmission unit and the first power receiver system.

19. The wireless recharge system of claim 1, wherein the power transmitter includes a communication unit to transmit a power unit communication signal and the first power receiver system comprises a power receiver system receiver for receiving the power unit communication signal, the power request signal and the power unit communication signal providing a two way communication link between the power transmission unit and the first power receiver system, wherein said two-way communication link must be established before the power transmitter is activated.

20. The wireless recharge system of claim 1, comprising a proximity detector arranged to detect an object within a security zone adjacent the energy receptor, the proximity detector operably connected to the first power receiver system to end transmission of the power request signal when an object is detected in the security zone.

21. The wireless recharge system of claim 20, wherein the proximity detector is selected from the group consisting of a motion detector and a translocator signal.

22. The wireless recharge system of claim 1, wherein the power transmitter transmits the directional wireless power beam at a plurality of frequencies.

23. The wireless recharge system of claim 1, wherein the power transmission unit is mounted to an airborne vehicle and the power receiver system is included in an emergency beacon for a vehicle, said power beam providing energy for said emergency beacon.

24. The wireless recharge system of claim 1, comprising an appliance incorporating the power receiver system and connected to receive energy from said energy beam converter and said energy storage unit.

25. The wireless recharge system of claim 1, comprising an appliance incorporating the power receiver system and connected to receive energy from said energy beam converter or said energy storage unit.

26. A wireless recharge system comprising:
an energy source;
a plurality of power transmission units operably connected to the energy source comprising:
a power transmitter configured to transmit energy as a directional wireless power beam when activated;
a communication receiver configured to detect a power request signal and provide a request indication;
a power unit controller operably connected to the communication receiver and the power transmitter, the power unit controller responsive to said request indication to activate said power transmitter; and
at least one appliance incorporating a first power receiver system comprising:
an energy receptor configured to receive the wireless power beam;
an energy storage unit;
an energy beam converter that transforms energy from the received wireless power beam to an energy form compatible with said energy storage unit;
a power usage monitor operatively connected to said energy storage unit to detect a quantity of power stored in said energy storage unit; and
a power receiver system transmitter that produces the power request signal as a function of the quantity of power stored in said energy storage unit as detected by said power usage monitor,
wherein said plurality of power transmission units are incorporated into a structure at least partially surrounding said at least one appliance and providing said directional power beam to said appliance when the first power receiver system produces the power request signal.

27. The wireless recharge system of claim 26, wherein said structure defines an interior space and said plurality of power transmission units are secured to said structure so that said at least one appliance is exposed to a directional power beam from at least one said power transmission unit.

28. The wireless recharge system of claim 26, wherein at least one of said power transmission units includes a communication unit to transmit a power unit communication signal and the first power receiver system includes a receiver to receive said power unit communication signal, the power request signal and the power unit communication signal providing for a two way communication link between the at least one power transmission unit and the appliance.

29. The wireless recharge system of claim 26, wherein at least one power transmission unit includes a communication unit to transmit a power unit communication signal and the first power receiver system comprises a receiver for receiving the power unit communication signal, the power request signal and the power unit communication signal providing a two way communication link between the power transmission unit and the first power receiver system, wherein said two-way communication link must be established before the power transmitter is activated.

30. A wireless recharge and communication system comprising:
an appliance equipped with a first power receiver system including a first information signal receiver and decoder;
an energy source;
a power transmission unit operably connected to the energy source and comprising:
a combination power transmitter and communication unit for wirelessly transmitting a combined directional energy beam and first information signal to the first power receiver system,
wherein said first information signal is received and decoded by said first power receiver system, said information signal permitting communication from said power transmission unit to said appliance.

31. The wireless recharge system of claim 30, wherein the first information signal originates from a signal source external to the power transmission unit and a communication interface connects the signal source to the power transmission unit.

32. The wireless recharge system of claim 30, wherein the appliance includes means for generating a second information signal and a wireless transmitter for encoding and sending said second information signal, said power transmission unit including a second receiver for receiving and decoding said second information signal, said first and second information signals permitting two-way communication between the power transmission unit and the appliance.

33. The wireless recharge system of claim 32, wherein the appliance is a cell phone, said signal source is a telephone network and said second information signal includes voice communications.

34. The wireless recharge system of claim 32, wherein the appliance is a computer, said signal source is the internet and said second information signal includes data from said computer.

35. A wireless power system comprising:
an energy source;
a power transmission unit operably connected to the energy source comprising:

power unit transmitter for transmitting energy as a wireless power beam to the first power receiver system, and power unit controller operably connected to the power unit transmitter for controlling the power unit transmitter, and a power unit communication transceiver for transmission of a first information signal and receipt of a second information signal; and an appliance equipped with a first power receiver system comprising:

a power receiver system transceiver for receiving the first information signal from the power unit transceiver and transmitting the second information signal to the power unit transceiver.

36. The wireless power system of claim 35, wherein said appliance is an electric wheelchair.

37. The wireless power system of claim 35, wherein said appliance is a cell phone.

38. The wireless power system of claim 35, wherein said appliance is a weapon system.

39. The wireless power system of claim 35, wherein said appliance is a people mover.

40. The wireless power system of claim 35, wherein the first and second information signals provide a bi-directional communication link between the power transmission unit and the appliance.

41. The wireless power system of claim 35, wherein a communication interface connects a signal source external to the power transmission unit to the power transmission unit, the first information signal originates from the signal source and the second information signal is sent to the signal source.

42. The wireless power system of claim 35, wherein the first power receiver system comprises a translocator and the second information signal comprises a translocator signal.

43. A method for wirelessly recharging an appliance incorporating a power receiver system having an energy receptor comprising:

monitoring the condition of an energy storage unit arranged to provide power to said appliance to determine a quantity of energy stored in said energy storage unit;

monitoring a quantity of energy consumed by the appliance;

starting transmission of a power request signal from the appliance as a function of the condition of the energy storage unit and the quantity of energy consumed by the appliance;

receiving the power request signal at a first power transmission unit;

transmitting a wireless power beam from a first power transmission unit to the energy receptor in response to receiving the power request signal;

stopping transmission of the power request signal from the appliance as a function of the condition of the energy storage unit and the quantity of energy consumed by the appliance; and ending transmission of the wireless power beam when said power request signal is stopped.

44. The method of claim 43, comprising the step of:

stopping transmission of the power beam upon interruption of the power request signal.

45. The method of claim 43, wherein the step of starting transmission of the power request signal occurs when a level of energy in the energy storage unit is below a pre-established level; and the step of stopping transmission of the power request signal occurs when said level of energy is at or above said pre-established level.

46. The method of claim 43, wherein the step of transmitting a power request signal comprises transmitting a data stream and said step of receiving said power request signal comprises receiving said data stream.

47. The method of claim 43, comprising the steps of:

stopping transmission of the power beam after a predetermined amount of energy has been transmitted;

acknowledging the receipt of the predetermined amount of energy by the power receiver system to the power transmission unit; and starting transmission of the power beam for a subsequent predetermined amount of energy after the step of acknowledging.

48. The method of claim 43, wherein the wireless power beam is in the form of discrete energy pulses each containing a predetermined amount of energy.

49. The method of claim 43, wherein the wireless power beam is in the form of discrete energy pulses each containing a predetermined amount of energy and the power beam request signal comprises an acknowledgment of receipt of the predetermined amount of energy at the energy receptor and comprising the step of:

stopping transmission of the power beam in response to a failure to acknowledge receipt of the power beam.

50. The method of claim 43, comprising:

transmitting a power unit communication signal from the power transmission unit;

receiving the power unit communication signal at the power receiver system;

establishing a two way communication link between the power transmission unit and the power receiver system; and stopping transmission of the power beam in response to a loss of the two-way communication link.

51. The method of claim 43, wherein the power receiver system is moving relative to the first power transmission unit and comprising the step of:

tracking a location of the moving power beam request signal.

* * * * *